(12) United States Patent
Hatanaka et al.

(10) Patent No.: US 8,501,393 B2
(45) Date of Patent: Aug. 6, 2013

(54) ANTI-REFLECTIVE COATING FORMING COMPOSITION CONTAINING VINYL ETHER COMPOUND

(75) Inventors: Tadashi Hatanaka, Toyama (JP); Shigeo Kimura, Toyama (JP); Tomoyuki Enomoto, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 140 days.

(21) Appl. No.: 11/596,391

(22) PCT Filed: May 11, 2005

(86) PCT No.: PCT/JP2005/008617
§ 371 (c)(1), (2), (4) Date: Aug. 27, 2007

(87) PCT Pub. No.: WO2005/111724
PCT Pub. Date: Nov. 24, 2005

(65) Prior Publication Data
US 2008/0138744 A1 Jun. 12, 2008

(30) Foreign Application Priority Data

May 14, 2004 (JP) ................................. 2004-144625
Dec. 7, 2004 (JP) ................................. 2004-353627

(51) Int. Cl.
*G03F 7/11* (2006.01)
*G03F 7/20* (2006.01)
*G03F 7/38* (2006.01)
*H01L 21/027* (2006.01)

(52) U.S. Cl.
USPC .................. 430/288.1; 430/271.1; 430/270.1; 430/272.1; 430/311; 430/326; 430/319

(58) Field of Classification Search
None
See application file for complete search history.

(56) References Cited

U.S. PATENT DOCUMENTS

| | | | | |
|---|---|---|---|---|
| 5,364,738 A * | 11/1994 | Kondo et al. | ............ | 430/283.1 |
| 6,110,653 A | 8/2000 | Holmes et al. | | |
| 6,156,479 A | 12/2000 | Meador et al. | | |
| 6,165,697 A | 12/2000 | Thackeray et al. | | |
| 6,319,651 B1 * | 11/2001 | Holmes et al. | ............ | 430/270.1 |
| 2003/0162120 A1 | 8/2003 | Yoon et al. | | |
| 2003/0215736 A1 | 11/2003 | Oberlander et al. | | |
| 2004/0018451 A1 | 1/2004 | Choi | | |
| 2004/0248037 A1 * | 12/2004 | Iwashima et al. | ............ | 430/281.1 |
| 2005/0214674 A1 * | 9/2005 | Sui et al. | ............ | 430/270.1 |
| 2005/0255410 A1 * | 11/2005 | Guerrero et al. | ............ | 430/311 |
| 2008/0283829 A1 * | 11/2008 | Kim et al. | ............ | 257/40 |

FOREIGN PATENT DOCUMENTS

| | | |
|---|---|---|
| JP | A 06-118631 | 4/1994 |
| JP | A 06-161110 | 6/1994 |
| JP | A 09-78031 | 3/1997 |
| JP | B2 2686898 | 8/1997 |
| JP | A 11-72925 | 3/1999 |
| JP | 2001255657 A * | 9/2001 |
| JP | A 2003-270793 | 9/2003 |
| JP | 2004020667 A * | 1/2004 |
| JP | 2004029053 A * | 1/2004 |
| JP | A 2004-054286 | 2/2004 |
| WO | WO 03/025674 A1 * | 3/2003 |
| WO | WO 03/057678 | 7/2003 |
| WO | WO 03/058345 A2 | 7/2003 |

OTHER PUBLICATIONS

English translation of JP, 2004-020667 A (2004) from machine translation from AIPN Japan Patent Office National Center for Industrial Property Information and Training, generated Jul. 23, 2009, 24 pages.*
English translation of JP 2004020667 A (Miyamoto), Derwent Information Ltd, Derwent week 200427, 4 pages, published in year 2004 no month found.*
English translation of JP, 2004-029053 A (2004) from machine translation from AIPN Japan Patent Office National Center for Industrial Property Information and Training, generated Jul. 23, 2009, 23 pages.*
English translation of JP 20040029053 A (Miyamoto), Derwent Information Ltd, Derwent week 200425 4 pages, published in year 2004 no month found.*
English translation of JP, 2001-255657 A (2001) from machine translation from AIPN Japan Patent Office National Center for Industrial Property Information and Training, generated Jul. 23, 2009, 6 pages.*
Pat-No: JP02001255657A, from JAPIO, 2001, English translation of JP 2001-255657 A (Uemitsu et al), 2 pages.*
European Search Report for Application No. EP 05 73 9255; mailed Mar. 8, 2010.

* cited by examiner

*Primary Examiner* — Cynthia Hamilton
(74) *Attorney, Agent, or Firm* — Oliff & Berridge, PLC

(57) ABSTRACT

There is provided an anti-reflective coating forming composition for use in a lithography of the manufacture of semiconductor devices and for forming an anti-reflective coating that can be developed with an alkaline developer for photoresist, and a method for forming photoresist pattern by use of the anti-reflective coating forming composition. The anti-reflective coating forming composition comprises a compound having at least two vinyl ether groups, an alkali-soluble compound having at least two phenolic hydroxy groups or carboxyl groups, a photoacid generator, and a solvent.

5 Claims, No Drawings

ANTI-REFLECTIVE COATING FORMING COMPOSITION CONTAINING VINYL ETHER COMPOUND

TECHNICAL FIELD

The present invention relates to an anti-reflective coating forming composition used in a lithography process of the manufacture of semiconductor devices, and a method for forming photoresist pattern by use of the anti-reflective coating forming composition. More specifically, the present invention relates to an anti-reflective coating forming composition for forming an anti-reflective coating that can be developed with an alkaline developer, and a method for forming photoresist pattern comprising simultaneously developing a photoresist and an anti-reflective coating, by use of the anti-reflective coating forming composition.

BACKGROUND ART

In the manufacture of semiconductor devices, micro-processing by lithography using a photoresist has been carried out. The micro-processing is a processing method comprising forming a thin film of a photoresist on a semiconductor substrate such as a silicon wafer or the like, irradiating actinic rays such as ultraviolet rays through a mask pattern on which a pattern for a device is depicted, developing it to obtain a photoresist pattern, and etching the substrate using the photoresist pattern as a protective film, thereby forming fine unevenness corresponding to the pattern on the surface of the substrate. On the other hand, in recent progress in high integration of devices, there has been a tendency that shorter wavelength actinic rays are being used, i.e., ArF excimer laser beam (193 nm) has been taking the place of KrF excimer laser beam (248 nm). However, in these photolithography processes, there occurs a problem that dimension accuracy of the photoresist pattern is lowered by an influence of standing wave due to reflection of exposure light from the substrate or an influence of random reflection of exposure light due to unevenness on the substrate. Accordingly, it has been widely studied to provide an anti-reflective coating between the photoresist and the substrate (bottom anti-reflective coating) in order to resolve the problem.

These anti-reflective coatings are often formed by use of a heat crosslinking composition in order to prevent intermixing with a photoresist applied thereon. Thus, the resulting anti-reflective coatings become insoluble in an alkaline developer used for development of photoresist and the removal of the anti-reflective coatings prior to semiconductor substrate processing is required to be carried out by dry etching (see, for example Patent Document 1).

However, the photoresist is removed simultaneously with the removal of the anti-reflective coating by dry etching. Therefore, there causes a problem that it becomes difficult to secure film thickness of the photoresist required for substrate processing. This becomes a very serious problem in case where thin photoresists are used for the purpose of improvement in developing property.

In addition, an ion implantation in the manufacture of semiconductor devices is a process for introducing impurities into a semiconductor substrate by use of a photoresist pattern as a template, and in order to avoid providing damage on the surface of the substrate, pattern formation of photoresist cannot be performed by dry etching process. Therefore, anti-reflective coating requiring removal by dry etching could not be formed as an underlayer of photoresist in photoresist pattern formation for ion implantation. The conventional photoresist pattern used as a template in the ion implantation process has a wide line-width and thereby was little affected by an influence of standing wave due to reflection of exposure light from the substrate or an influence of random reflection of exposure light due to unevenness on the substrate. Thus, problems by reflection have been resolved by use of a dye-containing photoresist or an anti-reflective coating as an upper layer of photoresist. However, with the recent miniaturization, a fine pattern begins to be required also for photoresist used in ion implantation process, and an anti-reflective coating as an underlayer of photoresist is being required.

Under these circumstances, it has been desired to develop an anti-reflective coating that can be dissolved in an alkaline developer used for development of photoresist and removed simultaneously with photoresist by development. On the other hand, anti-reflective coatings that can be removed simultaneously with photoresist by development have been studied until now (see, for example Patent Documents 2, 3, 4, 5 and 6). However, they were not enough in applicability for fine processing, formed pattern form, and the like.

Patent Document 1: U.S. Pat. No. 6,156,479 (2000)
Patent Document 2: JP Patent No. 2686898 (1997)
Patent Document 3: JP-A-9-78031 (1997)
Patent Document 4: JP-A-11-72925 (1999)
Patent Document 5: WO 03/057678 pamphlet
Patent Document 6: WO 03/058345 pamphlet

DISCLOSURE OF INVENTION

Problem to be Solved by Invention

The present invention is made taking the above-mentioned circumstances into account, and it is an object to provide an anti-reflective coating that is soluble in an alkaline developer and a composition for forming the anti-reflective coating. That is, the object of the present invention is to provide an anti-reflective coating forming composition used in the manufacture of semiconductor devices. More specifically, the object of the present invention is to provide an anti-reflective coating that causes no intermixing with a photoresist applied and formed thereon, dissolves in an alkaline developer and is able to be removed simultaneously with photoresist by developing, and to provide an anti-reflective coating forming composition for forming the anti-reflective coating.

In addition, an object of the present invention is to provide a method for forming photoresist pattern used in manufacture of semiconductor devices by use of the anti-reflective coating forming composition.

Means for Solving Problem

Taking the present status as mentioned above into account, the present inventors eagerly studied, and the result of it, they found that an excellent anti-reflective coating that is soluble in an alkaline developer can be formed by an anti-reflective coating forming composition comprising a compound having at least two vinyl ether groups, an alkali-soluble compound having at least two phenolic hydroxy groups or carboxyl groups, and a photoacid generator, and completed the present invention.

That is, the present invention relates to the following aspects:

as a first aspect, an anti-reflective coating forming composition comprising a compound having at least two vinyl ether groups, an alkali-soluble compound having at least two phenolic hydroxy groups or carboxyl groups, a photoacid generator, and a solvent;

as a second aspect, the anti-reflective coating forming composition as described in the first aspect, wherein the alkali-soluble compound is a polyimide;

as a third aspect, the anti-reflective coating forming composition as described in the first aspect, wherein the alkali-soluble compound is a polyamic acid;

as a fourth aspect, the anti-reflective coating forming composition as described in the first aspect, wherein the alkali-soluble compound is a polymer containing hydroxystyrene unit;

as a fifth aspect, the anti-reflective coating forming composition as described in the first aspect, wherein the alkali-soluble compound is a compound produced from a compound having at least two epoxy groups and a compound having at least two phenolic hydroxy groups or carboxyl groups;

as a sixth aspect, the anti-reflective coating forming composition as described in the first aspect, wherein the alkali-soluble compound is a phenol novolak or a cresol novolak;

as a seventh aspect, the anti-reflective coating forming composition as described in the first aspect, wherein the alkali-soluble compound is a polymer containing acrylic acid unit or methacrylic acid unit;

as an eighth aspect, the anti-reflective coating forming composition as described in the first aspect, wherein the alkali-soluble compound is a polymer containing a unit of formula (1):

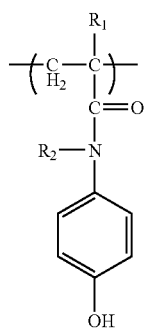

(1)

wherein $R_1$ and $R_2$ independently of each other are hydrogen atom or methyl, in an amount of 10% or more based on all units constituting the polymer;

as a ninth aspect, the anti-reflective coating forming composition as described in the first aspect, wherein the alkali-soluble compound is a compound of formula (2):

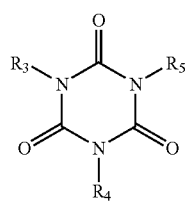

(2)

wherein $R_3$, $R_4$ and $R_5$ independently of one another are a group of formula (3):

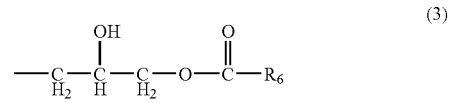

(3)

wherein $R_6$ is a benzene ring, naphthalene ring or anthracene ring having 1 to 3 hydroxy groups;

as a tenth aspect, the anti-reflective coating forming composition as described in the first aspect, further containing a light absorbing compound;

as an eleventh aspect, the anti-reflective coating forming composition as described in the first aspect, further containing an amine compound;

as a twelfth aspect, a method of forming a photoresist pattern used in a manufacture of a semiconductor device, comprising the steps of:

coating the anti-reflective coating forming composition as described in any one of the first to eleventh aspects on a semiconductor substrate and baking it to form an anti-reflective coating, forming a photoresist layer on the anti-reflective coating, exposing the semiconductor substrate covered with the anti-reflective coating and the photoresist layer to light, and developing it after the exposure; and as a thirteenth aspect, the method of forming a photoresist pattern as described in the twelfth aspect, wherein the exposure is carried out with light having a wavelength of 248 nm or 193 nm.

Effect of Invention

The use of the anti-reflective coating forming composition according to the present invention makes possible to form an anti-reflective coating that causes no intermixing with a photoresist, dissolves in an alkaline developer and is able to be removed simultaneously with photoresist by developing.

The anti-reflective coating formed from the anti-reflective coating forming composition according to the present invention can be removed without carrying out dry etching. In addition, the anti-reflective coating formed from the anti-reflective coating forming composition according to the present invention can be removed with an alkaline developer together with photoresist. Therefore, it can be used in a manufacture process of semiconductor devices containing steps sensitive to damages on substrate surface by dry etching, such as ion implantation process or the like.

BEST MODE FOR CARRYING OUT THE INVENTION

The anti-reflective coating forming composition of the present invention comprises a compound having at least two vinyl ether groups, an alkali-soluble compound having at least two phenolic hydroxy groups or carboxyl groups, a photoacid generator, and a solvent. In addition, the anti-reflective coating forming composition of the present invention can comprise further a light absorbing compound, a compound having an epoxy group, an amine compound and a surfactant, and the like.

The proportion of solid content in the anti-reflective coating forming composition according to the present invention is not specifically limited so long as each component is homogeneously dissolved, but for example 0.5 to 50 mass %, particularly 1 to 30 mass %, preferably 3 to 25 mass %, more preferably 5 to 20 mass %. In the specification, the solid content means all components in the anti-reflective coating forming composition from which the solvent component is excluded.

The anti-reflective coating forming composition of the present invention is concretely described.

Although the anti-reflective coating forming composition of the present invention contains a compound having at least two vinyl ether groups, a compound having 2 to 20, 3 to 10, particularly 4 to 6 vinyl ether groups is preferable.

The compound having at least two vinyl ether groups used in the present invention is not specifically limited, and includes for example bis(4-(vinyloxymethyl)cyclohexylmethyl)glutarate, tri(ethyleneglycol)divinylether, adipic acid divinyl ester, diethylene glycol divinyl ether, tris(4-vinyloxy) butyl trimellitate, bis(4-(vinyloxy)butyl)terephthalate, bis(4-(vinyloxy)butyl)isophthalate, ethylene glycol divinyl ether, 1,4-butanediol divinyl ether, tetramethylene glycol divinyl ether, tetraethylene glycol divinyl ether, neopentyl glycol divinyl ether, trimethylol propane trivinyl ether, trimethylol ethane trivinyl ether, hexane diol divinyl ether, 1,4-cyclohexanediol divinyl ether, tetraethylene glycol divinyl ether, pentaerythritol divinyl ether, pentaerythritol trivinyl ether and cyclohexane dimethanol divinyl ether, and the like. These compounds may be used alone or in a mixture of two or more.

The anti-reflective coating forming composition of the present invention contains an alkali-soluble compound having at least two phenolic hydroxy groups or carboxyl groups. The phrase "having at least two phenolic hydroxy groups or carboxyl groups" means that a sum of phenolic hydroxy groups and carboxyl groups contained in the compound is two or more. The alkali-soluble compound used in the present invention is not specifically limited so long as it has at least two phenolic hydroxy groups or carboxyl groups, and is a compound that is soluble in an alkaline developer used for development of photoresist.

Such compounds include polymers such as a phenol novolak, a cresol novolak, polyhydroxy styrene, polyamic acid, and polyacrylic acid or the like. As the polymers, polymers that all units (repeating structural units) constituting it have phenolic hydroxy group or carboxyl group can be used. In addition, polymers composed of units having phenolic hydroxy group or carboxyl group and units having no phenolic hydroxy group or carboxyl group can be used. In case where the polymers composed of units having phenolic hydroxy group or carboxyl group and units having no phenolic hydroxy group or carboxyl group are used, the proportion of the units having phenolic hydroxy group or carboxyl group is preferably 1% or more, for example 10% or more, particularly 20% or more based on all units constituting the polymer. From viewpoint of solubility in alkaline developer, the proportion is 5% to 99%, for example 10% to 90%, preferably 20% to 80%, more preferably 30% to 70%.

The alkali-soluble compounds used in the present invention include for example polymers of the following formulae (4) to (35). In the formulae, $p_1$, $p_2$, $p_3$ and $p_4$ independently of one another are the proportion of each unit in the polymer, respectively, and the sum thereof is 100%.

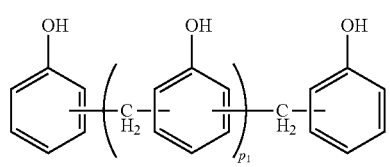

(4)

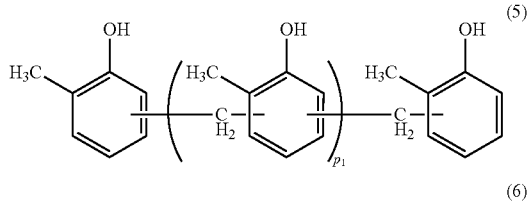

(5)

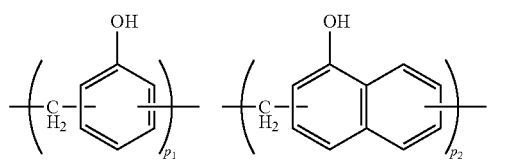

(6)

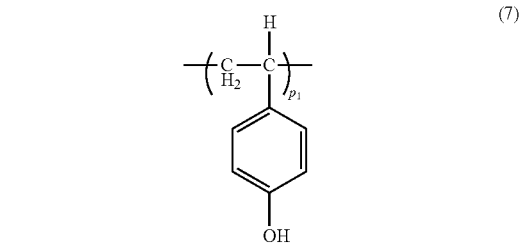

(7)

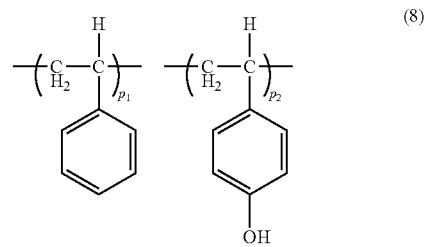

(8)

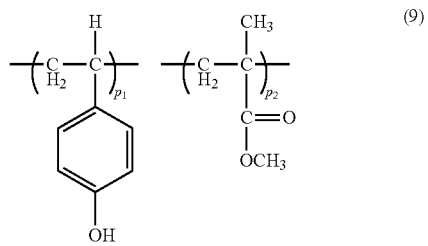

(9)

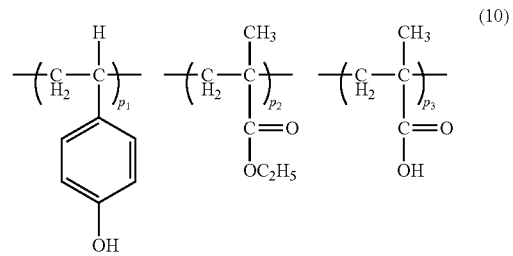

(10)

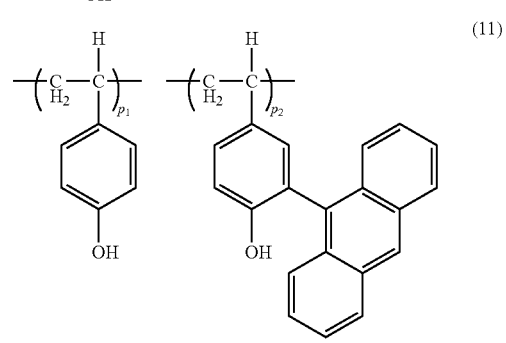

(11)

(12) 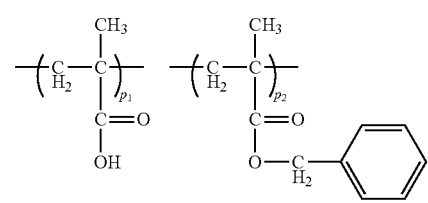
(13) 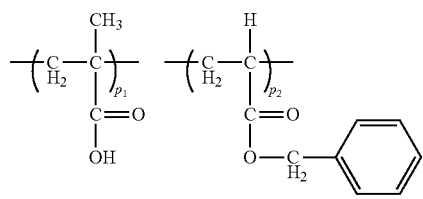
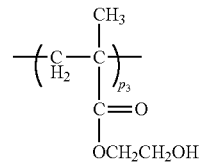
(14) 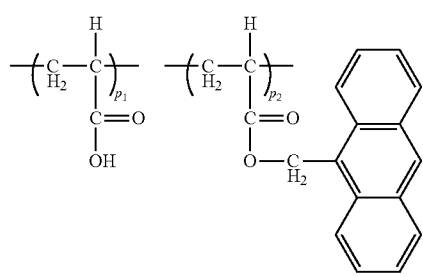
(15) 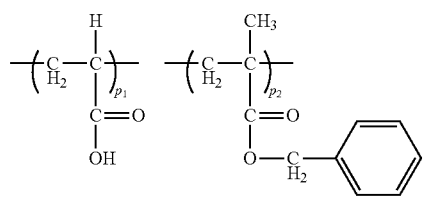
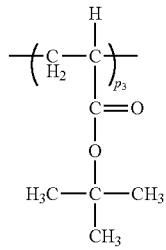
(16) 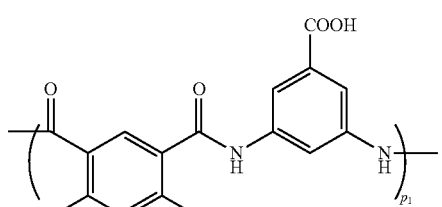
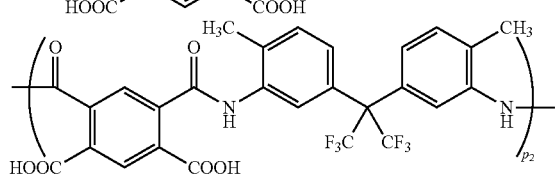
(17) 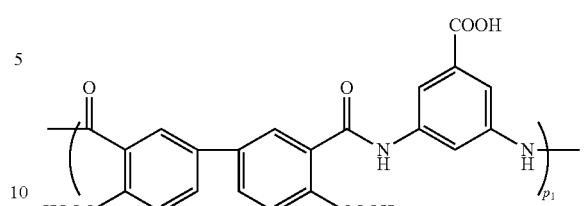
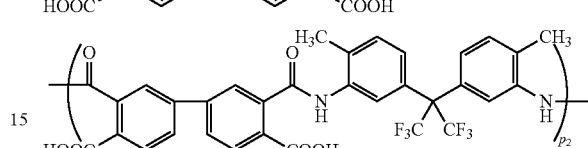
(18) 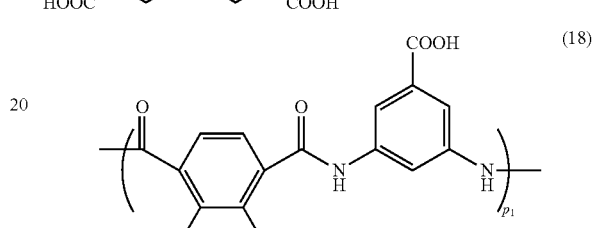
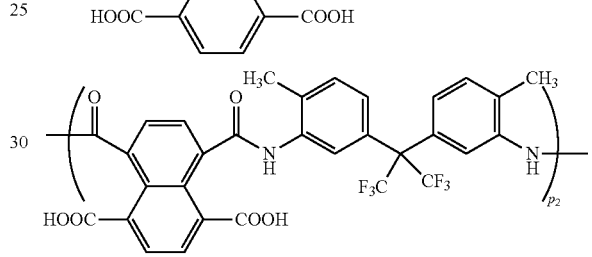
(19) 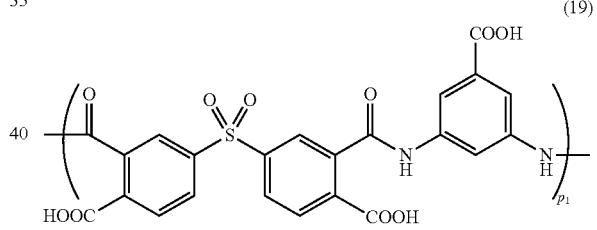
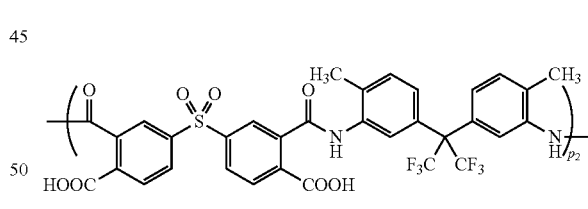
(20) 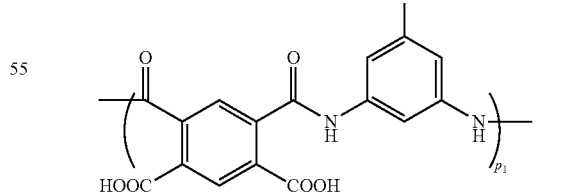
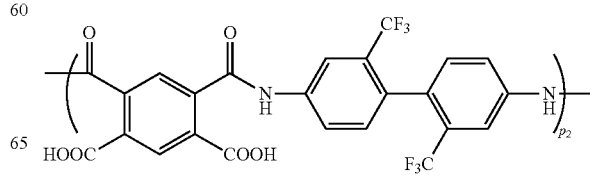

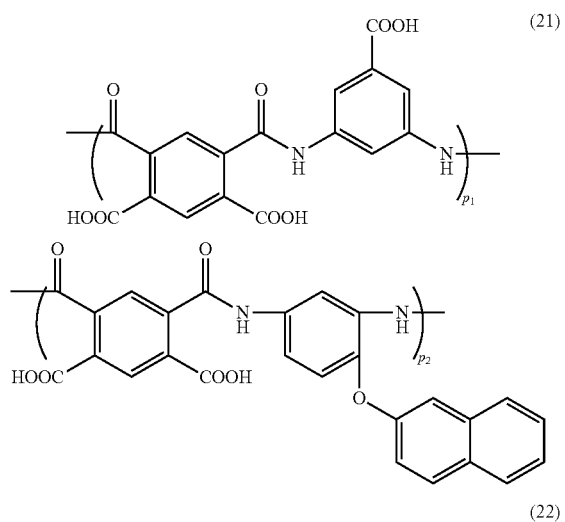
(21)
(22)
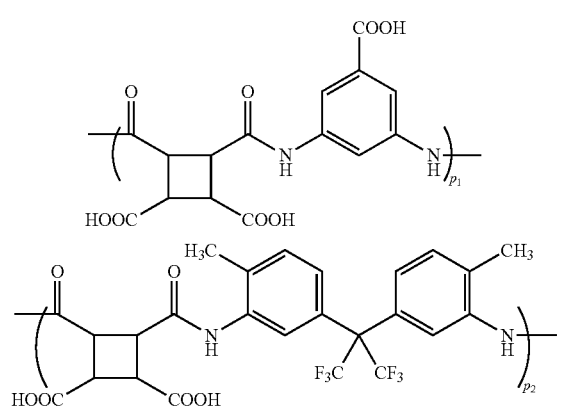
(22)
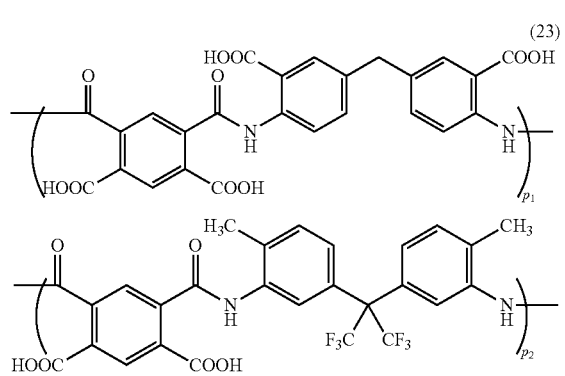
(23)
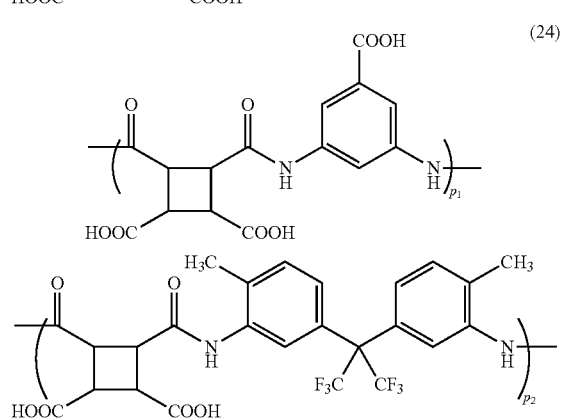
(24)
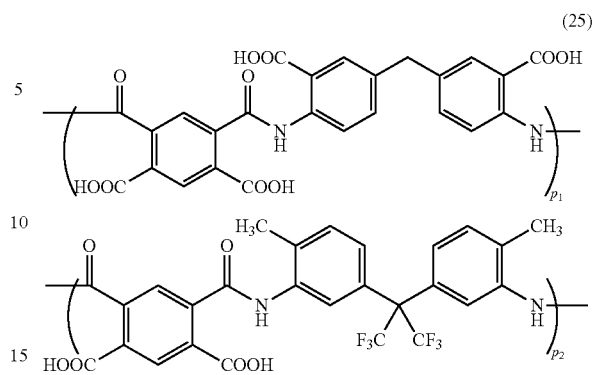
(25)
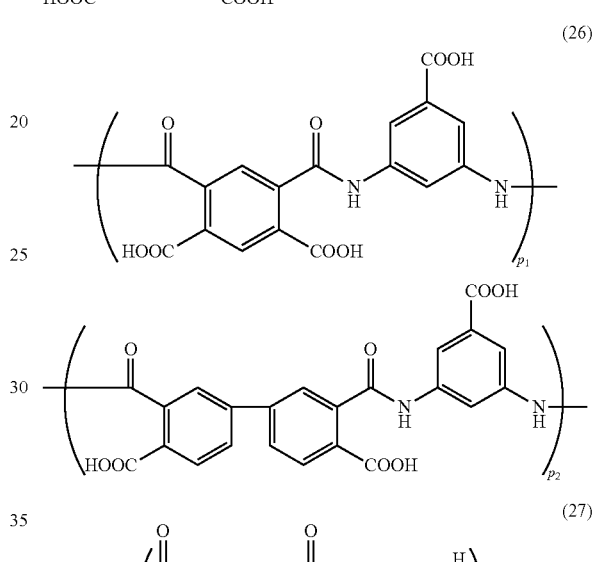
(26)
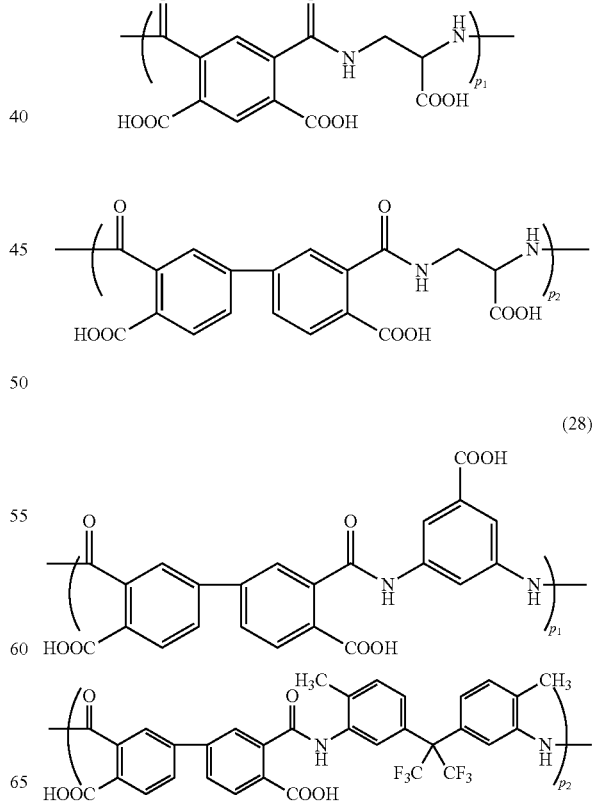
(27)
(28)

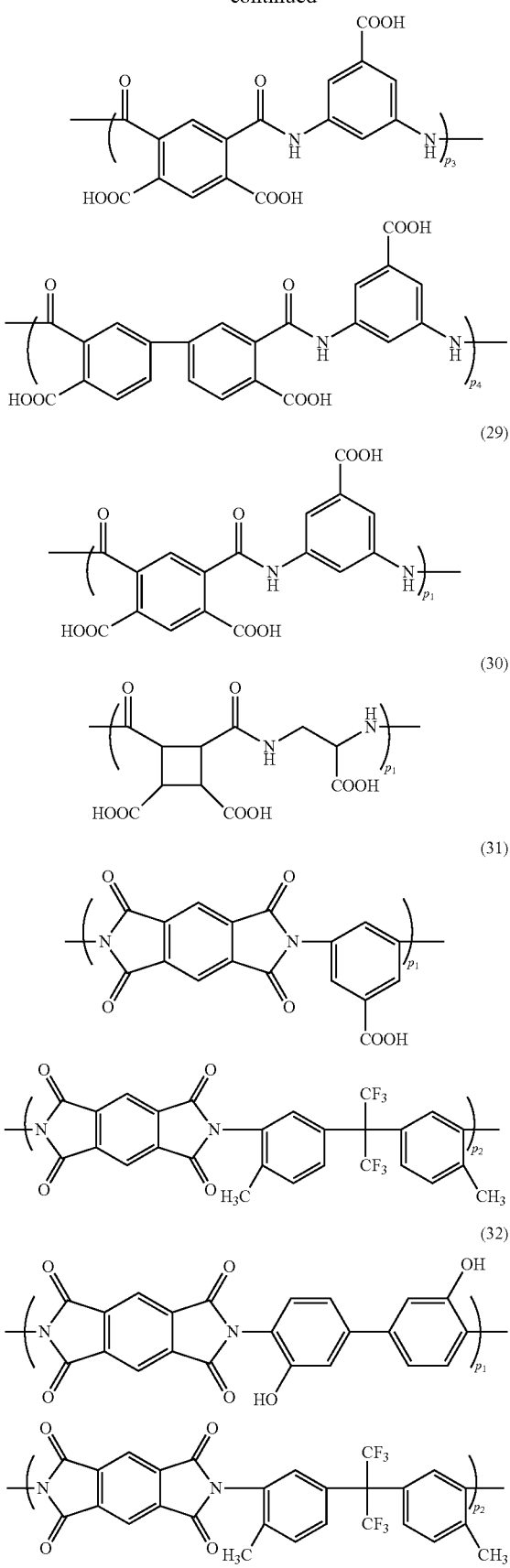
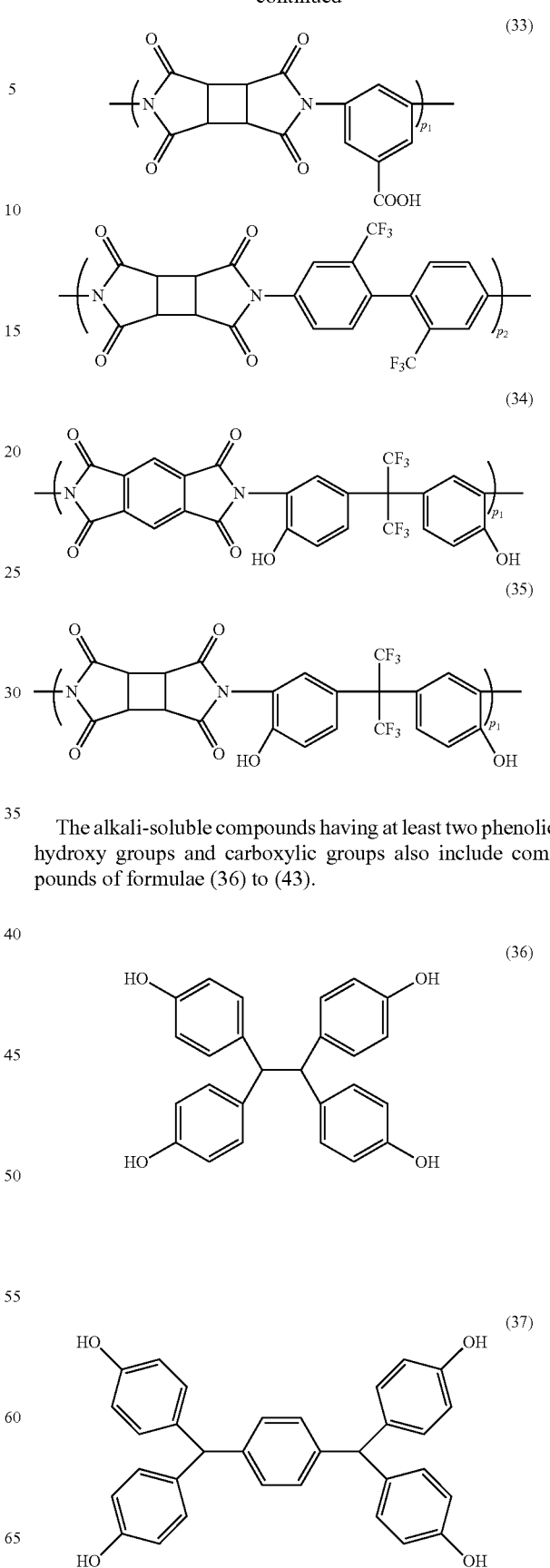
The alkali-soluble compounds having at least two phenolic hydroxy groups and carboxylic groups also include compounds of formulae (36) to (43).

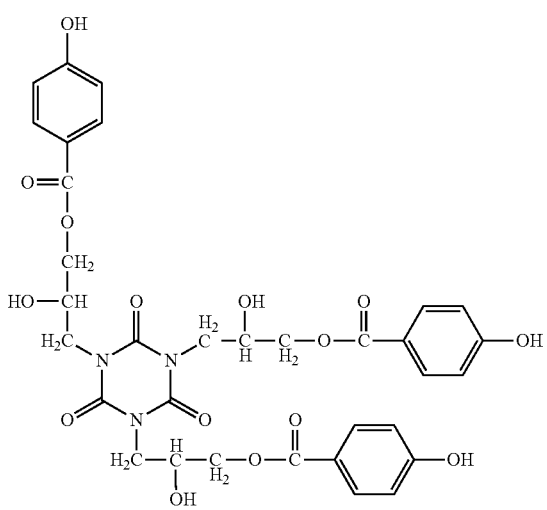
(38)
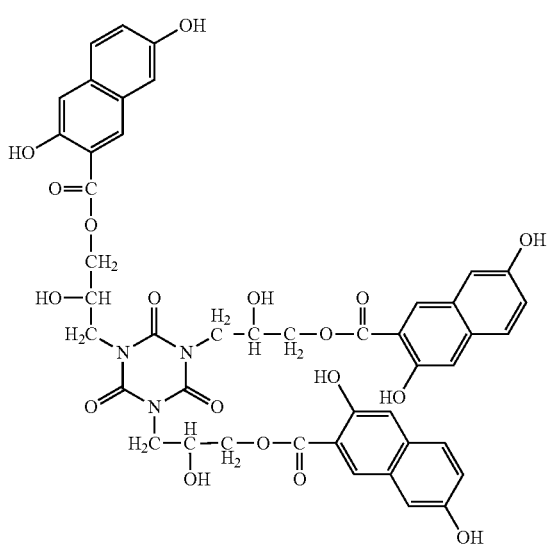
(39)
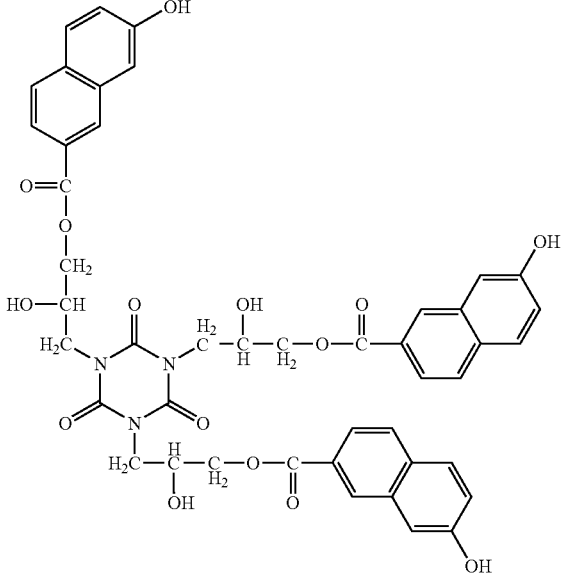
(40)
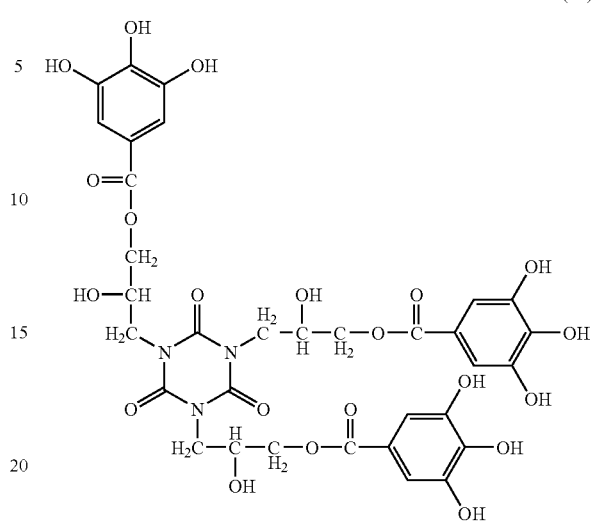
(41)
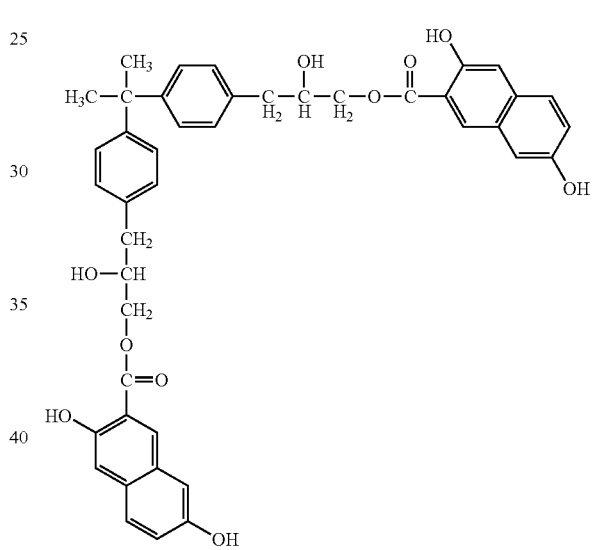
(42)
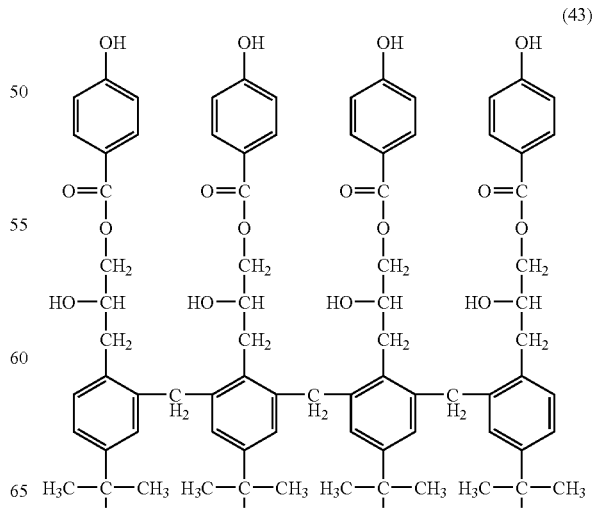
(43)

-continued

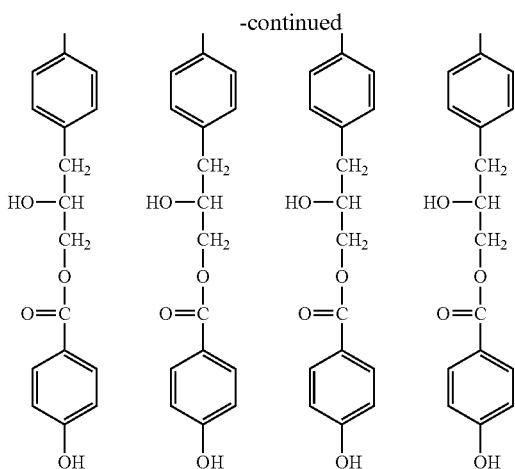

The alkali-soluble compounds include polymers containing hydroxystyrene units, for example polyhydroxystyrene. The alkali-soluble compounds also include polymers produced by polymerization of a compound having addition polymerizable double bond such as an acrylic acid ester compound, methacrylic acid ester compound, maleimide, and vinyl ether compound or the like with hydroxystyrene, for example polymers of formulae (8) to (11). From viewpoint of solubility in alkaline developer, it is preferable that the hydroxystyrene unit is contained in the proportion of 10% or more based on all units constituting the polymer. The proportion of the hydroxystyrene unit in the polymer is 10% or more, preferably 20% or more, for example 10% to 100%, preferably 20% to 90%, more preferably 30% to 70%.

The alkali-soluble compounds include polymers containing acrylic acid unit or methacrylic acid unit, for example polyacrylic acid or polymethacrylic acid polymers. Further, the alkali-soluble compounds also include polymers produced from a compound having addition polymerizable double bond such as an acrylic acid ester compound, methacrylic acid ester compound, and styrene compound or the like with acrylic acid or methacrylic acid, for example polymers of formulae (10), (12) to (15). From viewpoint of solubility in alkaline developer, it is preferable that the acrylic acid unit or methacrylic acid unit is contained in the proportion of 10% or more based on all units constituting the polymer. The proportion of the acrylic acid unit or methacrylic acid unit in the polymer is 10% or more, preferably 20% or more, for example 10% to 100%, preferably 20% to 90%, more preferably 30% to 70%.

The alkali-soluble compounds also include polyimides. The polyimides used in the present invention can be produced from a tetracarboxylic acid dianhydride compound with a diamine compound having phenolic hydroxy group or carboxyl group. The polyimides include for example polyimides of formulae (31) to (35). The polyimide of formula (31) can be obtained by a reaction of 1,2,4,5-benzene tetracarboxylic acid dianhydride compound with 3,5-diaminobenzoic acid and 2,2-bis(3-amino-4-toluoyl)hexafluoropropane.

The alkali-soluble compounds also include polyamic acids. The polyamic acids can be produced by a reaction of a diamine compound with tetracarboxylic acid or a tetracarboxylic acid dianhydride compound being the derivative thereof, or a dicarboxylic acid dihalide. The polyamic acids can be also produced by polymerizing a bis-silylated diamine compound with a tetracarboxylic acid dianhydride compound to synthesize a polyamidic acid silyl ester, and then by decomposing the silyl ester moiety thereof with an acid. The polyamic acids used in the present invention include for example polyamic acids of formula (16) to (30). For example, the polyamic acid of formula (20) can be obtained by a reaction of 1,2,4,5-benzene tetracarboxylic acid dianhydride compound with 3,5-diaminobenzoic acid and 2,2'-bis(trifluoromethyl)-4,4'-diaminophenyl.

The alkali-soluble compounds also include compounds produced from a compound having at least two epoxy groups with a compound having at least two phenolic hydroxy groups or carboxyl groups. Such compounds include compounds produced from a compound having at least two, for example two to six epoxy groups with a compound having at least two, for example two to six phenolic hydroxy groups or carboxyl groups.

Such compounds can be produced by reacting a compound having at least two epoxy groups with a compound having at least two phenolic hydroxy groups or carboxyl groups contained in an approximately equal molar amount to the epoxy groups in the presence of a catalyst such as quarternary ammonium salt or the like.

The compound having at least two epoxy groups includes for example tris(2,3-epoxypropyl)isocyanurate, 1,4-butanediol diglycidyl ether, 1,2-epoxy-4-(epoxyethyl)cyclohexanen, glycerol triglycidyl ether, diethylene glycol diglycidyl ether, 2,6-diglycidylphenyl glycidyl ether, 1,1,3-tris[p-(2,3-epoxypropoxy)phenyl]propane, 1,2-cyclohexanedicarboxylic acid diglycidyl ester, 4,4'-methylenebis(N,N-diglycidylaniline), 3,4-epoxycyclohexylmethyl-3,4-epoxycyclohexanecarboxylate, trimethyrolethanetriglycidylether, bisphenol-A-diglycidyl ether, and pentaerythritol polyglycidyl ether or the like.

The compound having at least two phenolic hydroxy groups or carboxyl groups includes for example 1,2,3-anthracene triol, 2,7,9-anthracene triol, 2-hydroxy-1-naphthoic acid, 7-hydroxy-1-naphthoic acid, 3-hydroxy-2-naphthoic acid, 2,6-naphthoic acid, 1-hydroxy-4-phenyl-3-naphthoic acid, 6-ethoxy-2,3-naphthalenediol, 4-hydroxybenzoic acid, 2-chloro-4-hydroxybenzoic acid, 2,4-dihydroxy-5-methylbenzoic acid, 3-hydroxybenzoic acid, 5-hydroxyisophthalic acid, 2,5-dihydroxybenzoic acid, terephthalic acid, 2-nitroterephthalic acid, 3,5-dibromo-4-hydroxybenzoic acid, 3,5-dibromo-2,4-dihydroxybenzoic acid, 3-iodo-5-nitro-4-hydroxybenzoic acid, 3,5-diiodo-2-hydroxybenzoic acid, 2,4,6-triiodo-3-hydroxybenzoic acid, 2,4,6-tribromo-3-hydroxybenzoic acid, and 2-bromo-4,6-dimethyl-3-hydroxybenzoic acid, or the like.

The compound produced from a compound having at least two epoxy groups with a compound having at least two phenolic hydroxy groups or carboxyl groups includes for example the compounds of formulae (38) to (43).

As the alkali-soluble compounds, the polymer having the unit of formula (1):

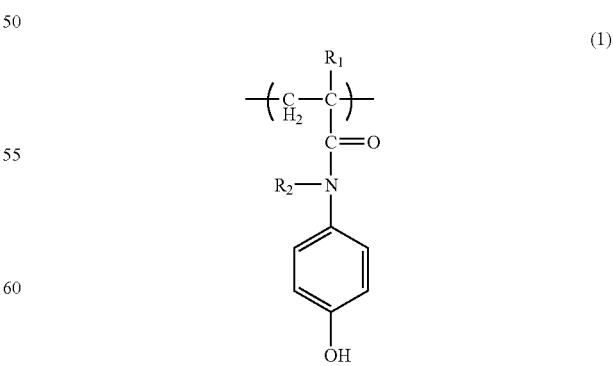

wherein $R_1$ and $R_2$ independently of each other are hydrogen atom or methyl can be used. From viewpoint of solubility in an alkaline developer, it is preferable that the unit of formula (1) is required to be contained in the proportion of 10% or more based on all units constituting the polymer. The proportion of the unit of the formula (1) in the polymer is 10% or more, preferably 20% or more, for example 10% to 100%, preferably 15% to 80%, more preferably 20% to 70%, most preferably 25% to 50%.

The polymer having the unit of formula (1) can be produced by polymerizing N-(4-hydroxyphenyl)methacrylamide, N-(4-hydroxyphenyl)acrylamide, N-methyl-N-(4-hydroxyphenyl)methacrylamide or N-methyl-N-(4-hydroxyphenyl)acrylamide by use of a polymerization initiator such as N,N'-azobisisobutyronitrile or the like.

The polymer having the unit of formula (1) may contain other units so long as the proportion of the unit of formula (1) in the polymer fulfils the above-mentioned value. The other units can be introduced in the polymer by using a polymerizable compound such as an acrylic acid ester compound, methacrylic acid ester compound, a maleimide compound, acrylonitrile, maleic anhydride, a styrene compound and a vinyl compound, or the like, when the polymer is produced.

The acrylic acid ester compound includes for example methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, tert-butyl acrylate, cyclohexyl acrylate, isobornyl acrylate, 2-methoxyethyl acrylate, methoxytriethylene glycol acrylate, mono-(2-acryloyloxy)ethyl)phthalate, 2-ethoxyethyl acrylate, tetrahydrofurfuryl acrylate, 3-methoxybutyl acrylate, 2-methyl-2-adamanthyl acrylate, 2-propyl-2-adamanthyl acrylate, 8-methyl-8-tricyclodecyl acrylate, 8-ethyl-8-tricyclodecyl acrylate, and 5-acryloyloxy-6-hydroxynorbornene-2-carboxylic-6-lactone, or the like.

The methacrylic acid ester compound includes for example methyl methacrylate, ethyl methacrylate, isopropyl methacrylate, benzyl methacrylate, naphthyl methacrylate, anthryl methacrylate, anthrylmethyl methacrylate, phenyl methacrylate, 2-hydroxyethyl methacrylate, 2-hydroxypropyl methacrylate, 2,2,2-trifluoroethyl methacrylate, tert-butyl methacrylate, cyclohexyl methacrylate, isobornyl methacrylate, 2-methoxyethyl methacrylate, methoxytriethylene glycol methacrylate, mono-(2-methacryloyloxy)ethyl)phthalate, 2-ethoxyethyl methacrylate, tetrahydrofurfuryl methacrylate, 3-methoxybutyl methacrylate, 2-methyl-2-adamanthyl methacrylate, 2-propyl-2-adamanthyl methacrylate, 8-methyl-8-tricyclodecyl methacrylate, 8-ethyl-8-tricyclodecyl methacrylate, and 5-methacryloyloxy-6-hydroxynorbornene-2-carboxylic-6-lactone, or the like.

The vinyl compound includes for example vinyl ether, methyl vinyl ether, benzyl vinyl ether, 2-hydroxyethyl vinyl ether, phenyl vinyl ether, and propyl vinyl ether, or the like.

The styrene compound includes for example styrene, methyl styrene, chloro styrene, bromo styrene, and hydroxy styrene, or the like.

The maleimide compound includes for example maleimide, N-methylmaleimide, N-phenylmaleimide, and N-cyclohexylmaleimide, or the like.

The polymer having the unit of formula (1) in the antireflective coating forming composition of the present invention includes for example the polymers of formulae (44) to (49). In the formulae, $q_1$, $q_2$, $q_3$ and $q_4$ independently of one another are the proportion of each unit in the polymer, respectively, $q_1$ is 10% or more, and a sum thereof is 100%.

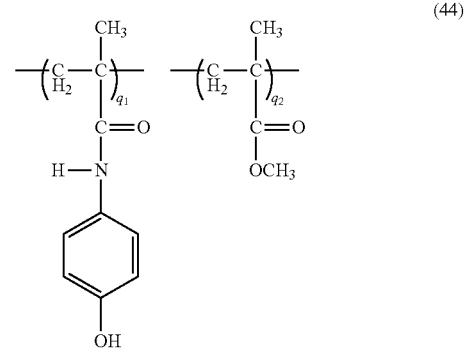

(44)

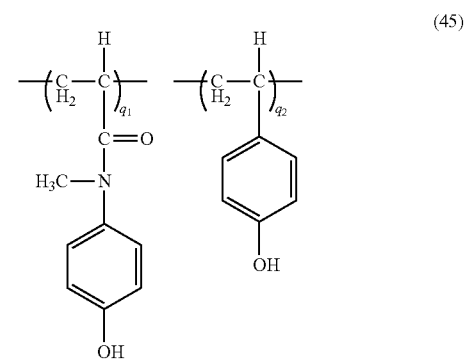

(45)

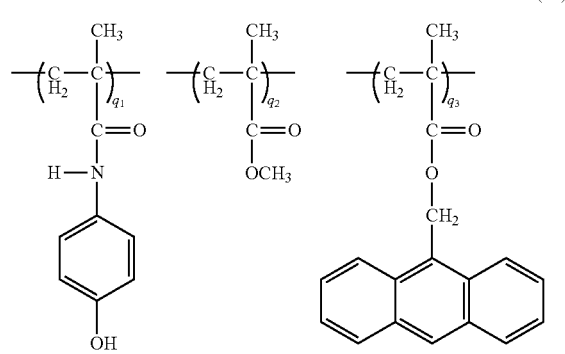

(46)

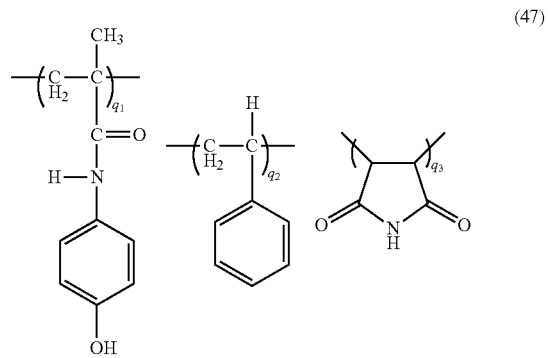

(47)

-continued (48)

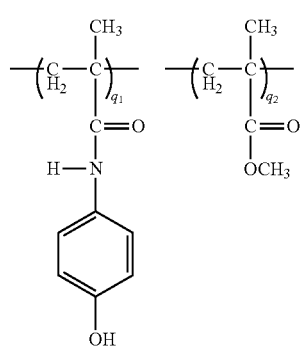

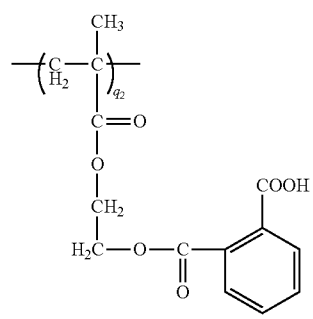

(49)

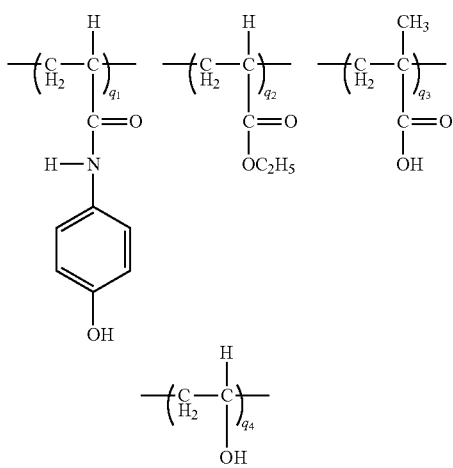

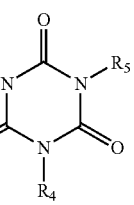

As the alkali-soluble compound, a compound of formula (2):

(2)

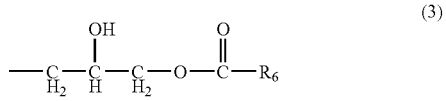

wherein $R_3$, $R_4$ and $R_5$ independently of one another are a group of formula (3):

$$\begin{array}{c}(3)\\ \text{—}\underset{H_2}{C}\text{—}\underset{H}{\overset{OH}{C}}\text{—}\underset{H_2}{C}\text{—}O\text{—}\overset{O}{\underset{\parallel}{C}}\text{—}R_6\end{array}$$

wherein $R_6$ is a benzene ring, naphthalene ring or anthracene ring having 1 to 3 hydroxy groups, can be also used.

Such a compound can be produced by reacting tris(2,3-epoxypropyl)isocyanurate with a benzoic acid compound, a naphthoic acid compound or an anthracene carboxylic acid compound having 1 to 3 hydroxy groups. The reaction can be carried out in the presence of a catalyst such as benzyltriethyl ammonium chloride or the like in an organic solvent by suitably selecting a condition of a reaction time of 0.5 to 30 hours and a reaction temperature of 20 to 200° C.

The benzoic acid compound having 1 to 3 hydroxy groups includes for example 4-hydroxybenzoic acid, 2-chloro-4-hydroxybenzoic acid, 2,4-dihydroxy-5-methylbenzoic acid, 3-hydroxybenzoic acid, 2,5-dihydroxybenzoic acid, 3,5-dibromo-4-hydroxybenzoic acid, 3,5-dibromo-2,4-dihydroxybenzoic acid, 3-iodo-5-nitro-4-hydroxybenzoic acid, 3,5-diiodo-2-hydroxybenzoic acid, 2,4,6-triiodo-3-hydroxybenzoic acid, 2,4,6-tribromo-3-hydroxybenzoic acid, 3,4,5-trihydroxybenzoic acid and 2-bromo-4,6-dimethyl-3-hydroxybenzoic acid and the like.

The naphthoic acid compound having 1 to 3 hydroxy groups includes for example 2-hydroxy-1-naphthoic acid, 7-hydroxy-1-naphthoic acid, 3-hydroxy-2-naphthoic acid, 1-hydroxy-4-phenyl-3-naphthoic acid, 5-hydroxy-1-naphthoic acid, 3,7-dihydroxy-2-naphthoic acid, 2,4-dihydroxy-2-naphthoic acid and 1,6-dibromo-2-hydroxy-3-naphthoic acid, and the like.

The anthracene carboxylic acid compound having 1 to 3 hydroxy groups includes for example 10-hydroxy-anthracene-9-carboxylic acid and the like.

The compound of formula (2) in the anti-reflective coating forming composition of the present invention includes for example the compounds of formulae (38) to (41).

When a polymer such as a phenol novolak, a cresol novolak, polyhydroxy styrene, polyamic acid, polyimide and the polymer having the unit of formula (1) is used as the alkali-soluble compound, the molecular weight of the polymer is for example 500 to 500000 in terms of weight average molecular weight. From viewpoint of coating applicability of the anti-reflective coating forming composition on a semiconductor substrate, or the like, the molecular weight is preferably 500 to 200000, more preferably 1000 to 100000, most preferably 2000 to 50000, particularly 3000 to 30000.

These alkali-soluble compounds having at least two phenolic hydroxy groups or carboxyl groups may be used alone or a combination of two or more.

The anti-reflective coating forming composition according to the present invention contains a photoacid generator. As the photoacid generator, any compounds can be used without any limit so long as they are compounds generating an acid by irradiation of light used for exposure. For example, it includes diazomethane compounds, onium salt compounds, sulfone imide compounds, nitrobenzyl compounds, benzoin tosylate compounds, halogen-containing triazine compounds, and cyano group-containing oxime sulfonate compounds, etc. Among them, the onium salt compounds are suitable as the photoacid generator.

The onium salt compounds include iodonium salt compounds such as diphenyl iodonium hexafluorophosphate, diphenyl iodonium trifluoromethane sulfonate, diphenyl iodonium nonafluoro-n-butane sulfonate, diphenyl iodonium perfluoro-n-octane sulfonate, diphenyliodonium camphor sulfonate, bis(4-t-butylphenyl)iodonium camphor sulfonate and bis(4-tert-butylphenyl)iodonium trifluoromethane sulfonate, etc., and sulfonium salt compounds such as triphenylsulfonium hexafluoroantimonate, triphenylsulfonium nonafluoro-n-butane sulfonate, triphenylsulfonium camphor sulfonate and triphenylsulfonium trifluoromethane sulfonate, etc.

The sulfone imide compounds include for example N-(trifluoromethane sulfonyloxy)succinimide, N-(nonafluoro-n-butanesulfonyloxy)succinimide, N-(camphorsulfonyloxy)succinimide and N-(trifluoromethanesulfonyloxy)naphthalimide, etc.

The proportion of the compound having at least two vinyl ether groups in the anti-reflective coating forming composition according to the present invention is for example 10 to 150 mass parts, preferably 20 to 100 mass parts, more preferably 30 to 80 mass parts based on 100 mass parts of the alkali-soluble compound having at least two phenolic hydroxy groups or carboxyl groups. In case where the proportion of the compound having at least two vinyl ether groups is less than 10 mass parts, the resulting anti-reflective coating is insufficient in curing, and often causes intermixing with photoresist. On the other hand, also in case where the proportion of the compound having at least two vinyl ether groups is over 150 mass parts, the resulting anti-reflective coating is lowered in crosslink density, and may cause intermixing with photoresist. The used proportion of the photoacid generator is for example 1 to 20 mass parts, preferably 2 to 10 mass parts based on 100 mass parts of the alkali-soluble compound having at least two phenolic hydroxy groups or carboxyl groups. In case where the used proportion of the photoacid generator is less than 1 mass part, the rate of the generated acid is lowered, and thus the exposed part is lowered in the solubility in an alkaline developer, and residue are often present after development. On the other hand, in case where the proportion of the photoacid generator is over 20 mass parts, the resulting anti-reflective coating forming composition is often lowered in shelf stability, and thus it often has an effect on the shape of photoresist.

The above-mentioned anti-reflective coating forming composition according to the present invention can further contain a light absorbing compound. The light absorbing compounds are not specifically limited so long as they have an absorption for light used in exposure to light. Compounds having an aromatic ring structure such as anthracene ring, naphthalene ring, benzene ring, quinoline ring and triazine ring, etc. are preferably used. In addition, from viewpoint that it does not inhibit solubility in an alkaline developer of the anti-reflective coating, compounds having phenolic hydroxyl group, carboxyl group, hydroxy group or sulfonic acid group are preferably used.

The light absorbing compounds having a high absorption for light of a wavelength 248 nm include for example anthracene carboxylic acid, hydroxymethyl anthracene, and 3,7-dihydroxy-2-naphthoic acid, and the like.

The light absorbing compounds also include the polymers having the unit of formula (50), (51) or (52), or the compound of formula (53), and the like. In formula (53), Ar is benzene ring, naphtharene ring or anthracene ring that may be substituted by a substituent selected from the group consisting of $C_{1-5}$alkyl, $C_{1-5}$alkoxy, fluorine atom, chlorine atom, bromine atom, nitro, cyano, $C_{1-5}$thiolkyl, phenoxy, acetyl, $C_{1-5}$alkoxycarbonyl and vinyl.

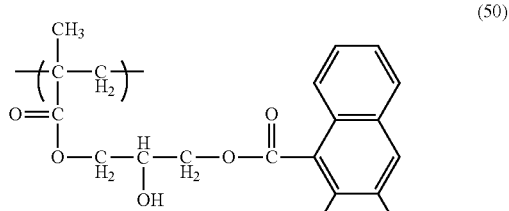

(50)

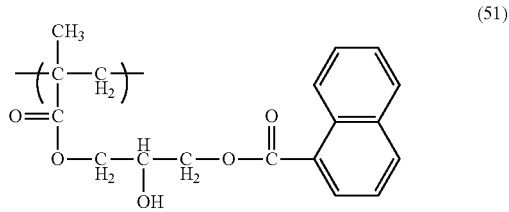

(51)

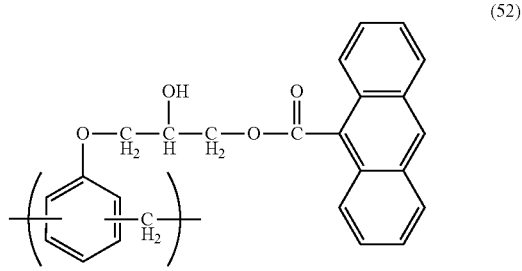

(52)

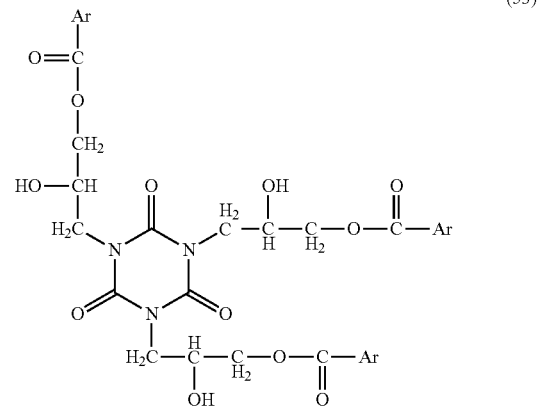

(53)

The light absorbing compounds can be used alone or in a combination of two or more compounds. When the light absorbing compounds are used, the content amount thereof is for example 1 to 300 mass parts, preferably 1 to 200 mass parts, more preferably 3 to 100 mass parts, most preferably 5 to 50 mass parts based on 100 mass parts of the alkali-soluble compound. If the content amount of the light absorbing compounds is more than 300 mass parts, the solubility in alkaline developer of an anti-reflective coating is often lowered, and the anti-reflective coating often causes intermixing with photoresist. The alternation of the kind and content amount of the light absorbing compounds permits the control of attenuation coefficient (k) and refractive index (n) of the anti-reflective coating.

The above-mentioned anti-reflective coating forming composition according to the present invention can further contain an amine compound. The addition of the amine compound can lead to an improvement of the shelf stability of the anti-reflective coating composition, and an inhibition of the diffusion of acid generated from the photoacid generator in the exposed part in the anti-reflective coating to the unexposed part of the anti-reflective coating.

The amine compound is not specifically limited, and includes for example tertiary amines such as triethanol amine, tributanol amine, trimethyl amine, triethyl amine, tri-n-propyl amine, triisopropyl amine, tri-n-butyl amine, tri-tert-butyl amine and diazabicyclooctane, etc., and aromatic amines such as pyridine and 4-dimethylamino pyridine, etc. The amine compound further includes primary amine such as benzyl amine and n-butyl amine, etc., and secondary amines such as diethyl amine and di-n-butyl amine, etc.

The amine compounds can be used alone or in a combination of two or more compounds. When the amine compounds are used, the content amount thereof is for example 0.001 to 5 mass parts, preferably 0.01 to 1 mass part, more preferably 0.1 to 0.5 mass part based on 100 mass parts of the alkali-soluble compound. If the content amount of the amine compounds is more than the above-mentioned upper limit, the sensitivity is often lowered.

The anti-reflective coating forming composition according to the present invention can contain a compound having at least two epoxy groups in order to control dissolution rate of the formed anti-reflective coating in an alkaline developer. The compound having at least two epoxy groups include for example compounds having 2 to 6 epoxy groups, concretely tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris[p-(2,3-epoxypropoxy)phenyl]propane, 1,2-cyclohexane dicarboxylic acid diglycidyl ester, 4,4'-methylene bis(N,N-diglycidylaniline), 3,4-epoxycyclohexylmethyl-3,4-epoxycyclohexane carboxylate, trimethylol ethane triglycidyl ether and bisphenol-A-diglycidyl ether, and pentaerythritol polyglycidyl ether, and the like.

As a compound having at least two epoxy groups, polymers having epoxy groups can be used. The polymers can be used without any specific limit so long as they contain epoxy groups. The polymers can be produced by addition polymerization with addition polymerizable monomer having epoxy group, or by a reaction of a polymer having hydroxyl group with a compound containing epoxy group such as epichlorohydrin, glycidyltosylate or the like. For example, polyglycidyl acrylate, addition polymerized polymers such as a copolymer of glycidylmethacrylate and ethylmethacrylate, a copolymer of glycidylmethacrylate, styrene and 2-hydroxyethylmethacrylate, etc., and condensation polymerized polymers such as epoxy novolak, etc. can be mentioned as concrete examples of the polymers.

The compound having at least two epoxy groups also includes epoxy resins having amino group such as YH-434, YH-434L (manufactured by Tohto Kasei Co., Ltd.), etc., epoxy resins having cyclohexene oxide structure such as Epoleed GT-401, GT-403, GT-301, GT-302, Ceroxide 2021, Ceroxide 3000 (manufactured by Daicel chemical Industries, Ltd.), etc., bisphenol A type epoxy resins such as Epicoat 1001, 1002, 1003, 1004, 1007, 1009, 1010, 828 (manufactured by Yuka-Shell Epoxy Co., Ltd.), etc., bisphenol F type epoxy resins such as Epicoat 807 (manufactured by Yuka-Shell Epoxy Co., Ltd.), etc., phenol novolak type epoxy resins such as Epicoat 152, 154 (manufactured by Yuka-Shell Epopxy Co., Ltd.), EPPN 201, 202 (manufactured by Nippon Kayaku Co., Ltd.), etc., cresol novolak type epoxy resins such as EOCN-102, EOCN-103S, EOCN-104S, EOCN-1020, EOCN-1025, EOCN-1027 (manufactured by Nippon Kayaku Co., Ltd.), Epicoat 180S75 (manufactured by Yuka-Shell Epoxy Co., Ltd.), etc., alicyclic epoxy resins such as Denacol EX-252 (manufactured by Nagase ChemteX Corporation), CY175 CY177, CY179 (manufactured by CIBA-GEIGY A.G.), Araldite CY-182, CY-192, CY-184 (manufactured by CIBA-GEIGY A.G.), Epichlone 200, 400 (manufactured by Dainippon Ink and Chemicals Incorporated), Epicoat 871, 872 (manufactured by Yuka-Shell Epoxy Co., Ltd.), ED-5661, ED-5662 (manufactured by Celanese Coating Co., Ltd.), etc., aliphatic polyglycidyl ether such as Denacol EX-611, EX-612, EX-614, EX-622, EX-411, EX-512, EX-522, EX-421, EX-313, EX-314, EX-321 (manufactured by Nagase ChemteX Corporation), etc.

The content amount of the compound having at least two epoxy groups is for example 50 mass parts or less, preferably 30 mass parts or less based on 100 mass parts of the alkali-soluble compound. If the content amount thereof is over 50 mass parts, a sufficient solubility for the alkaline developer cannot be acquired.

The anti-reflective coating forming composition according to the present invention can contain surfactants. The surfactants include, for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether; polyoxyethylene/polyoxypropylene block copolymers, etc., sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., EFTOP EF301, EF303, EF352 (Tochem Products Co., Ltd.), MEGAFAC F171, F173 (Dainippon Ink and Chemicals, Inc.), FLUORAD FC430, FC431 (Sumitomo 3M Limited), ASAHI GUARD AG710, SURFLON S-382, SC101, SC102, SC103, SC104, SC105, SC106 (Asahi Glass Co., Ltd.), organosiloxane polymer KP341 (Shinetsu Chemical Co., Ltd.), etc. The blending amount of the surfactants is usually 0.2 mass % or less, preferably 0.1 mass % or less, in all components of the anti-reflective coating forming composition according to the present invention. The surfactants may be added singly or in a combination of two or more.

The anti-reflective coating forming composition according to the present invention may optionally contain rheology controlling agents, adhesion auxiliaries and the like.

The anti-reflective coating forming composition according to the present invention can be easily prepared by homogeneously mixing the above-mentioned components and is dissolved in a suitable solvent and used in a state of solution. The solvent includes for example ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, and N-methylpyrrolidone, etc. These solvents may be used singly or in combination of two or more of them. Further, high boiling solvents such as propylene glycol monobutyl ether or propylene glycol monobutyl ether acetate, etc. may be mixed and used.

It is preferable that the anti-reflective coating forming composition solution prepared as mentioned above is filtered through a filter having a bore size of ca. 0.2 μm and used. The anti-reflective coating forming composition solution prepared as mentioned above is excellent also in shelf stability at room temperature.

Hereinafter, the utilization of the anti-reflective coating forming composition according to the present invention is described.

On a semiconductor substrate (for example, silicon/silicon dioxide coat substrate, silicon nitride substrate, glass substrate, ITO substrate or the like), the anti-reflective coating forming composition according to the present invention is coated by a suitable coating method, for example, with a spinner, a coater or the like, and thereafter the substrate is baked to fabricate an anti-reflective coating. The conditions of baking are suitably selected from baking temperature of 80 to 250° C. and baking time of 0.3 to 60 minutes. Preferably, the baking temperature is 130 to 250° C. and the baking time is 0.5 to 5 minutes. The thickness of the anti-reflective coating is for example 10 to 3000 nm, preferably 30 to 1000 nm, more preferably 50 to 500 nm.

The anti-reflective coating formed from the anti-reflective coating forming composition according to the present invention becomes a tough coating having a crosslink structure by reacting a phenolic hydroxy group or a carboxyl group of the alkali-soluble compound having at least two phenolic hydroxy groups or carboxyl groups under a condition of baking by which the coating is formed. Therefore, the anti-reflective coating comes to have a low solubility in an organic solvent generally used as a photoresist solution applied on the anti-reflective coating, for example ethylene glycol monomethyl ether, methyl cellosolve acetate, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclohexanone, ethyl 2-hydroxypropionate, ethyl 2-hydroxy-2-methylpropionate, ethyl ethoxyacetate, methyl pyruvate, ethyl lactate, butyl lactate, or the like. Thus, the anti-reflective coating formed from the anti-reflective coating forming composition according to the present invention cause no intermixing with photoresist. When the temperature on baking is less than the above-mentioned lower limit, crosslink structure becomes insufficient and intermixing with photoresist often occurs. On the other hand, when the baking temperature is too high, crosslink structure is broken and intermixing with photoresist often occurs.

Next, a photoresist layer is formed on the anti-reflective coating. The formation of the photoresist layer can be conducted by a general process, that is, by application of a photoresist solution on the anti-reflective coating and baking.

The photoresist to be coated and formed on the anti-reflective coating of the present invention is not specifically limited so long as it is sensitive to an exposure light, and any of negative type and positive type photoresists can be used. The photoresist includes a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular compound which is decomposed with an acid and increases the alkali dissolution rate of the photoresist, a chemically-amplified photoresist consisting of a photoacid generator, a binder having a group which is decomposed with an acid and increases the alkali dissolution rate, and a low molecular compound which is decomposed with an acid and increases the alkali dissolution rate of the photoresist. For example, trade name: APEX-E manufactured by Shipley Company, trade name: PAR710 manufactured by Sumitomo Chemical Co., Ltd., and trade name: SEPR430 manufactured by Shinetsu Chemical Co., Ltd., and the like can be mentioned.

Subsequently, exposure to light is carried out through a predetermined mask. For the exposure to light, KrF excimer laser beam (wavelength 248 nm), ArF excimer laser beam (wavelength 193 nm) and F2 excimer laser beam (wavelength 157 nm), etc. can be used. After the exposure, post exposure bake (PEB) may be performed, if necessary. The conditions of the post exposure bake are suitably selected from baking temperature of 80 to 150° C. and baking time of 0.3 to 60 minutes.

The anti-reflective coating formed from the anti-reflective coating forming composition according to the present invention becomes soluble in an alkaline developer used for development of photoresist by action of acid generated from the photoacid generator contained in the anti-reflective coating on exposure to light.

Next, development is conducted by use of an alkaline developer. The development results in removal of the exposed part of the photoresist and the part of the anti-reflective coating present under the photoresist.

The alkaline developer includes for example alkaline aqueous solution e.g., an aqueous solutions of alkali metal hydroxide such as potassium hydroxide, sodium hydroxide or the like, aqueous solution of quaternary ammonium hydroxide such as tetramethylammonium hydroxide, tetraethylammonium hydroxide, chlorine or the like, amine aqueous solution such as ethanolamine, propylamine, ethylenediamine or the like. Further, surfactants can be added in these developers.

The condition of development is suitably selected from a temperature of 5 to 50° C. and a time of 10 to 300 seconds. The anti-reflective coating formed from the anti-reflective coating forming composition according to the present invention can be easily developed at room temperature by use of 2.38 mass % aqueous solution of tetramethylammonium hydroxide that is generally used for the development of photoresist.

The anti-reflective coating of the present invention can be used as a layer for preventing an interaction between the substrate and the photoresist, as a layer having a function that prevents an adverse effect against the substrate by the material used for the photoresist or by substances formed on exposure to light of the photoresist, as a layer having a function that prevents diffusion and adverse effects of substances formed in the substrate on baking under heating to the upper layer photoresist, or as a barrier layer for reducing any poisoning effect of the photoresist layer by the semiconductor substrate dielectric layer.

Hereinafter, the present invention will be described based on examples but the present invention is not limited thereto.

EXAMPLES

Example 1

Synthesis of Alkali-Soluble Compound

In 118 g of cyclohexanone, 19.0 g of 3,7-dihydroxy-2-naphthoic acid, 10 g of tris(2,3-epoxypropyl)isocyanurate, and 0.552 g of benzyltriethyl ammonium chloride were reacted at 130° C. for 24 hours to obtain solution [a] containing alkali-soluble compound (compound of formula (36)).
(Preparation of Anti-Reflective Coating Forming Composition)

To 14.0 g of the solution [a], 1.40 g of tris(4-vinyloxy)butyltrimellitate, 0.105 g of triphenylsulfoniumtrifluoromethane sulfonate, 52.3 g of propylene glycol monomethyl ether and 67.5 g of propylene glycol monomethyl ether acetate were added, and stirred at room temperature for 30 minutes to prepare anti-reflective coating forming composition solution [1].
(Evaluation of Anti-Reflective Coating Forming Composition)

The anti-reflective coating forming composition solution [1] was coated on a semiconductor substrate (silicon wafer) using a spinner and the substrate was heated at 170° C. for 1 minute on a hot plate to form an anti-reflective coating having a film thickness of 60 nm. The resulting anti-reflective coating was insoluble in ethyl lactate and propylene glycol monomethyl ether acetate. Measurement of the anti-reflective coating by an ellipsometer indicated a refractive index (n) of 1.80 and an attenuation coefficient (k) of 0.50 at wavelength 248 nm, and a refractive index (n) of 1.55 and an attenuation coefficient (k) of 0.30 at wavelength 193 nm.

The anti-reflective coating forming composition solution [1] was coated on a silicon wafer using a spinner and the substrate was heated at 170° C. for 1 minute on a hot plate to form an anti-reflective coating having a film thickness of 60 nm. On the resulting anti-reflective coating, a positive type photoresist layer for KrF was formed, and exposed to light with KrF excimer laser beam (wavelength 248 nm) through a mask. After post exposure bake at 110° C. for 1.5 minute, puddle development was carried out with 2.38 mass % tetramethylammonium hydroxide aqueous solution (manufactured by Tokyo Ohka Kogyo Co., Ltd., trade name: NMD-3) for 60 seconds. The anti-reflective coating was dissolved in the exposed part together with that of the photoresist, and no remaining coating was observed.

Example 2

Synthesis of Alkali-Soluble Compound

In 155 g of N-methylpyrrolidone, 3.80 g of 3,5-diaminobenzoic acid, 9.06 g of 2,2-bis(3-amino-4-toluoyl)hexafluoropropane, and 9.51 g of 1,2,3,4-cyclobutane tetracarboxylic acid dianhydride were added and then reacted at room temperature for 24 hours. N-methylpyrrolidone was added to dilute in a concentration of 8.0 mass %, and then acetic anhydride and pyridine were added, and dehydration-ring closure reaction was carried out at 40° C. for 2 hours. The resulting solution was poured in water, filtered off and dried to obtain polyimide (formula (54), $p_1$: 50%, $p_2$: 50%) as powder. The resulting polyimide had a weight average molecular weight of 28000 (in terms of standard polystyrene).

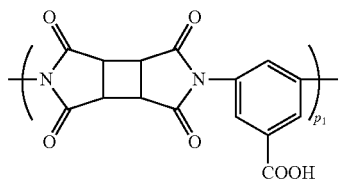

(54)

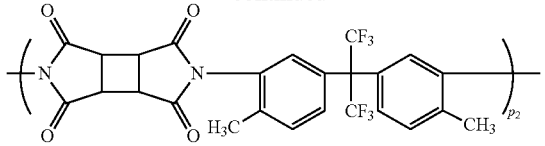

The polyimide was dissolved in propylene glycol monomethyl ether in a concentration of 30 mass % to obtain solution [b] containing alkali-soluble compound.
(Preparation of Anti-Reflective Coating Forming Composition)

To 10.0 g of the solution [b], 6.50 g of tris(4-vinyloxy)butyltrimellitate, 5 g of the above-mentioned solution [a], 0.135 g of triphenylsulfoniumtrifluoromethane sulfonate, 52.3 g of propylene glycol monomethyl ether and 67.5 g of propylene glycol monomethyl ether acetate were added, and stirred at room temperature for 30 minutes to prepare anti-reflective coating forming composition solution [2].
(Evaluation of Anti-Reflective Coating Forming Composition)

The anti-reflective coating forming composition solution [2] was coated on a silicon wafer substrate using a spinner and the substrate was heated at 150° C. for 1 minute on a hot plate to form an anti-reflective coating having a film thickness of 60 nm. The resulting anti-reflective coating was insoluble in ethyl lactate and propylene glycol monomethyl ether acetate. Measurement of the anti-reflective coating by an ellipsometer indicated a refractive index (n) of 1.81 and an attenuation coefficient (k) of 0.21 at wavelength 248 nm, and a refractive index (n) of 1.49 and an attenuation coefficient (k) of 0.39 at wavelength 193 nm.

The anti-reflective coating forming composition solution [2] was coated on a silicon wafer substrate using a spinner and the substrate was heated at 150° C. for 1 minute on a hot plate to form an anti-reflective coating having a film thickness of 40 nm. On the resulting anti-reflective coating, a positive type photoresist layer for KrF was formed, and exposed to light with KrF excimer laser beam (wavelength 248 nm) through a mask. After post exposure bake at 110° C. for 1.5 minute, puddle development was carried out with 2.38 mass % tetramethylammonium hydroxide aqueous solution (manufactured by Tokyo Ohka Kogyo Co., Ltd., trade name: NMD-3) for 60 seconds. The anti-reflective coating was dissolved in the exposed part together with that of the photoresist, and no remaining coating was observed.

Example 3

Synthesis of Alkali-Soluble Compound

In 45.5 g of propylene glycol monomethyl ether, 3.60 g of methyl methacrylate, 6.37 g of N-(4-hydroxyphenyl)methacrylamide, 5.00 g of mono-2-(methacryloyloxy)ethylphthalate, 0.30 g of N,N'-azobisisobutyronitrile and 0.34 g of dodecane thiol were added and then reacted at 70° C. for 20 hours to obtain a solution containing an alkali-soluble compound (polymer of formula (48), $q_1$: 40%, $q_2$: 40%, $q_3$: 20%). This solution was added in diethyl ether, and the resulting precipitate was washed with diethyl ether twice times to obtain a polymer as white solid. The resulting polymer had a weight average molecular weight of 8700 (in terms of standard polystyrene). This polymer was dissolved in propylene glycol monomethyl ether to obtain solution [c] having 20 mass %.
(Preparation of Anti-Reflective Coating Forming Composition)

To 12.0 g of the solution [c], 120 g of propylene glycol monomethyl ether, 0.60 g of tris(4-vinyloxy)butyltrimellitate and 0.09 g of triphenylsulfoniumtrifluoromethane sulfonate were added, and stirred at room temperature for 30 minutes to prepare anti-reflective coating forming composition solution [3].

(Evaluation of Anti-Reflective Coating Forming Composition)

The anti-reflective coating forming composition solution [3] was coated on a silicon wafer substrate using a spinner and the substrate was heated at 120° C. for 1 minute on a hot plate to form an anti-reflective coating having a film thickness of 70 nm. The resulting anti-reflective coating was insoluble in ethyl lactate and propylene glycol monomethyl ether acetate. Measurement of the anti-reflective coating by an ellipsometer indicated a refractive index (n) of 1.69 and an attenuation coefficient (k) of 0.14 at wavelength 248 nm, and a refractive index (n) of 1.58 and an attenuation coefficient (k) of 0.35 at wavelength 193 nm.

The anti-reflective coating forming composition solution-[3] was coated on a silicon wafer substrate using a spinner and the substrate was heated at 120° C. for 1 minute on a hot plate to form an anti-reflective coating having a film thickness of 70 nm. On the resulting anti-reflective coating, a positive type photoresist layer for KrF was formed, and exposed to light with KrF excimer laser beam (wavelength 248 nm) through a mask. After post exposure bake at 130° C. for 1.5 minute, puddle development was carried out with 2.38 mass % tetramethylammonium hydroxide aqueous solution (manufactured by Tokyo Ohka Kogyo Co., Ltd., trade name: NMD-3) for 60 seconds. The anti-reflective coating was dissolved in the exposed part together with that of the photoresist, and no remaining coating was observed.

Example 4

Synthesis of Alkali-Soluble Compound

In 37.6 g of propylene glycol monomethyl ether, 0.65 g of methyl methacrylate, 3.06 g of N-(4-hydroxyphenyl)methacrylamide, 3.00 g of mono-2-(methacryloyloxy)ethylphthalate, 2.38 g of 9-anthrylmethyl methacrylate, 0.14 g of N,N'-azobisisobutyronitrile and 0.16 g of dodecane thiol were added and then reacted at 70° C. for 24 hours to obtain a solution containing an alkali-soluble compound (polymer of formula (55), $q_1$: 40%, $q_2$: 15%, $q_3$: 25%, $q_3$: 20%). This solution was added in diethyl ether, and the resulting precipitate was washed with diethyl ether twice times to obtain a polymer as white solid. The resulting polymer had a weight average molecular weight of 11000 (in terms of standard polystyrene). This polymer was dissolved in propylene glycol monomethyl ether to obtain solution [d] having 20 mass %.

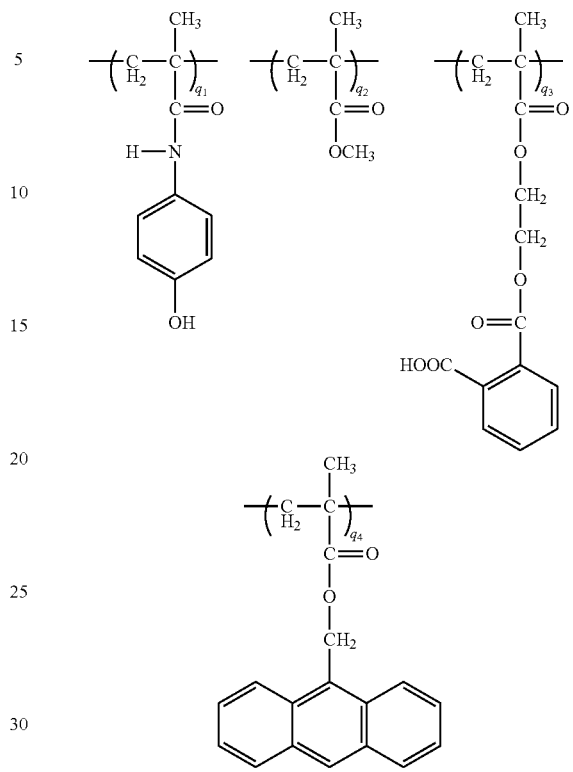

(55)

(Preparation of Anti-Reflective Coating Forming Composition)

To 14.0 g of the solution [d], 0.56 g of tris(4-vinyloxy) butyltrimellitate, 0.08 g of triphenylsulfoniumtrifluoromethane sulfonate, 0.008 g of triethanol amine, and 120 g of propylene glycol monomethyl ether were added, and stirred at room temperature for 30 minutes to prepare anti-reflective coating forming composition solution [4].

(Evaluation of Anti-Reflective Coating Forming Composition)

The anti-reflective coating forming composition solution [4] was coated on a silicon wafer substrate using a spinner and the substrate was heated at 120° C. for 1 minute on a hot plate to form an anti-reflective coating having a film thickness of 70 nm. The resulting anti-reflective coating was insoluble in ethyl lactate and propylene glycol monomethyl ether acetate. Measurement of the anti-reflective coating by an ellipsometer indicated a refractive index (n) of 1.59 and an attenuation coefficient (k) of 0.34 at wavelength 248 nm, and a refractive index (n) of 1.61 and an attenuation coefficient (k) of 0.37 at wavelength 193 nm.

The anti-reflective coating forming composition solution [4] was coated on a silicon wafer substrate using a spinner and the substrate was heated at 120° C. for 1 minute on a hot plate to form an anti-reflective coating having a film thickness of 70 nm. On the resulting anti-reflective coating, a positive type photoresist layer for KrF was formed, and exposed to light with KrF excimer laser beam (wavelength 248 nm) through a mask. After post exposure bake at 110° C. for 1.5 minute, puddle development was carried out with 2.38 mass % tetramethylammonium hydroxide aqueous solution (manufactured by Tokyo Ohka Kogyo Co., Ltd., trade name: NMD-3) for 60 seconds. The anti-reflective coating was dissolved in the exposed part together with that of the photoresist, and no remaining coating was observed.

Example 5

Synthesis of Polyamic Acid

In 63.9 g of propylene glycol monomethyl ether, 1.40 g of hydroxyethyl methacrylate, 5.09 g of N-(4-hydroxyphenyl)methacrylamide, 5.00 g of mono-2-(methacryloyloxy)ethylphthalate, 3.97 g of 9-anthrylmethyl methacrylate, 0.24 g of N,N'-azobisisobutyronitrile and 0.27 g of dodecane thiol were added and then reacted at 70° C. for 24 hours to obtain a solution containing an alkali-soluble compound (polymer of formula (56), $q_1$: 40%, $q_2$: 15%, $q_3$: 25%, $q_3$: 20%). This solution was added in diethyl ether, and the resulting precipitate was washed with diethyl ether twice times to obtain a polymer as white solid. The resulting polymer had a weight average molecular weight of 11000 (in terms of standard polystyrene). This polymer was dissolved in propylene glycol monomethyl ether to obtain solution [e] having 20 mass %.

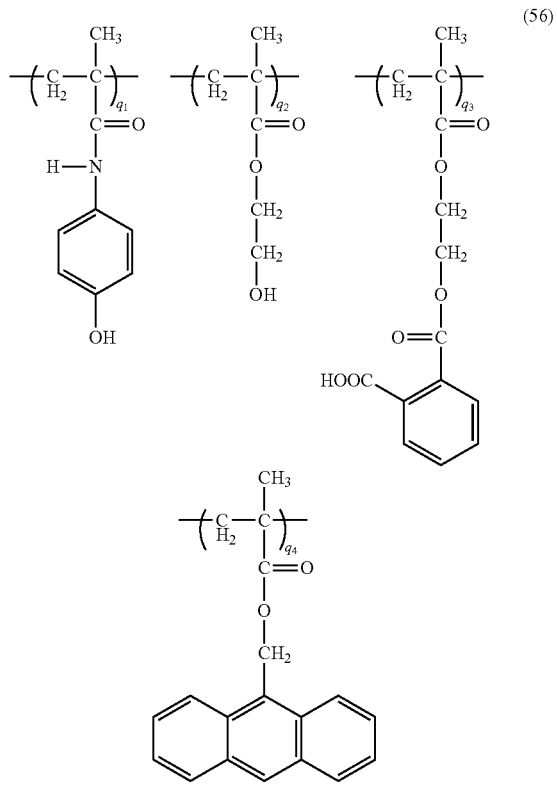

(56)

(Preparation of Anti-Reflective Coating Forming Composition)

To 14.0 g of the solution [e], 0.56 g of tris(4-vinyloxy)butyltrimellitate, 0.08 g of triphenylsulfoniumtrifluoromethane sulfonate, 0.008 g of triethanol amine, and 120 g of propylene glycol monomethyl ether were added, and stirred at room temperature for 30 minutes to prepare anti-reflective coating forming composition solution [5].

(Evaluation of Anti-Reflective Coating Forming Composition)

The anti-reflective coating forming composition solution [5] was coated on a silicon wafer substrate using a spinner and the substrate was heated at 120° C. for 1 minute on a hot plate to form an anti-reflective coating having a film thickness of 70 nm. The resulting anti-reflective coating was insoluble in ethyl lactate and propylene glycol monomethyl ether acetate. Measurement of the anti-reflective coating by an ellipsometer indicated a refractive index (n) of 1.59 and an attenuation coefficient (k) of 0.34 at wavelength 248 nm, and a refractive index (n) of 1.61 and an attenuation coefficient (k) of 0.37 at wavelength 193 nm.

The anti-reflective coating forming composition solution [5] was coated on a silicon wafer substrate using a spinner and the substrate was heated at 120° C. for 1 minute on a hot plate to form an anti-reflective coating having a film thickness of 70 nm. On the resulting anti-reflective coating, a positive type photoresist layer for KrF was formed, and exposed to light with KrF excimer laser beam (wavelength 248 nm) through a mask. After post exposure bake at 110° C. for 1.5 minute, puddle development was carried out with 2.38 mass % tetramethylammonium hydroxide aqueous solution (manufactured by Tokyo Ohka Kogyo Co., Ltd., trade name: NMD-3) for 60 seconds. The anti-reflective coating was dissolved in the exposed part together with that of the photoresist, and no remaining coating was observed.

Comparative Example 1

Preparation of Anti-Reflective Coating Forming Composition

To 14.0 g of solution [a] of Example 1, 1.40 g of bisaminoglycidylphenyl methane, 0.105 g of triphenylsulfonium trifluoromethane sulfonate, 52.3 g of propylene glycol monomethyl ether and 67.5 g of propylene glycol monomethyl-ether acetate were added, and stirred at room temperature for 30 minutes to prepare anti-reflective coating forming composition solution [6].

(Evaluation of Anti-Reflective Coating Forming Composition)

The anti-reflective coating forming composition solution [6] was coated on a silicon wafer using a spinner and the substrate was heated at 170° C. for 1 minute on a hot plate to form an anti-reflective coating having a film thickness of 60 nm. The resulting anti-reflective coating was insoluble in ethyl lactate and propylene glycol monomethyl ether acetate. Measurement of the anti-reflective coating by an ellipsometer indicated a refractive index (n) of 1.8 and an attenuation coefficient (k) of 0.50 at wavelength 248 nm, and a refractive index (n) of 1.53 and an attenuation coefficient (k) of 0.30 at wavelength 193 nm.

The anti-reflective coating formed from the anti-reflective coating forming composition solution [6] was insoluble in 2.38% tetramethylammonium hydroxide aqueous solution (manufactured by Tokyo Ohka Kogyo Co., Ltd., trade name: NMD-3).

The invention claimed is:

1. An anti-reflective coating forming composition for forming an anti-reflective coating that is used as an underlayer of a resist, the composition comprising a compound having at least two vinyl ether groups, an alkali-soluble compound having at least two phenolic hydroxy groups or carboxyl groups, a photoacid generator, and a solvent, the alkali-soluble compound comprising at least one compound selected from the group consisting of:
a polyimide selected from the group consisting of:
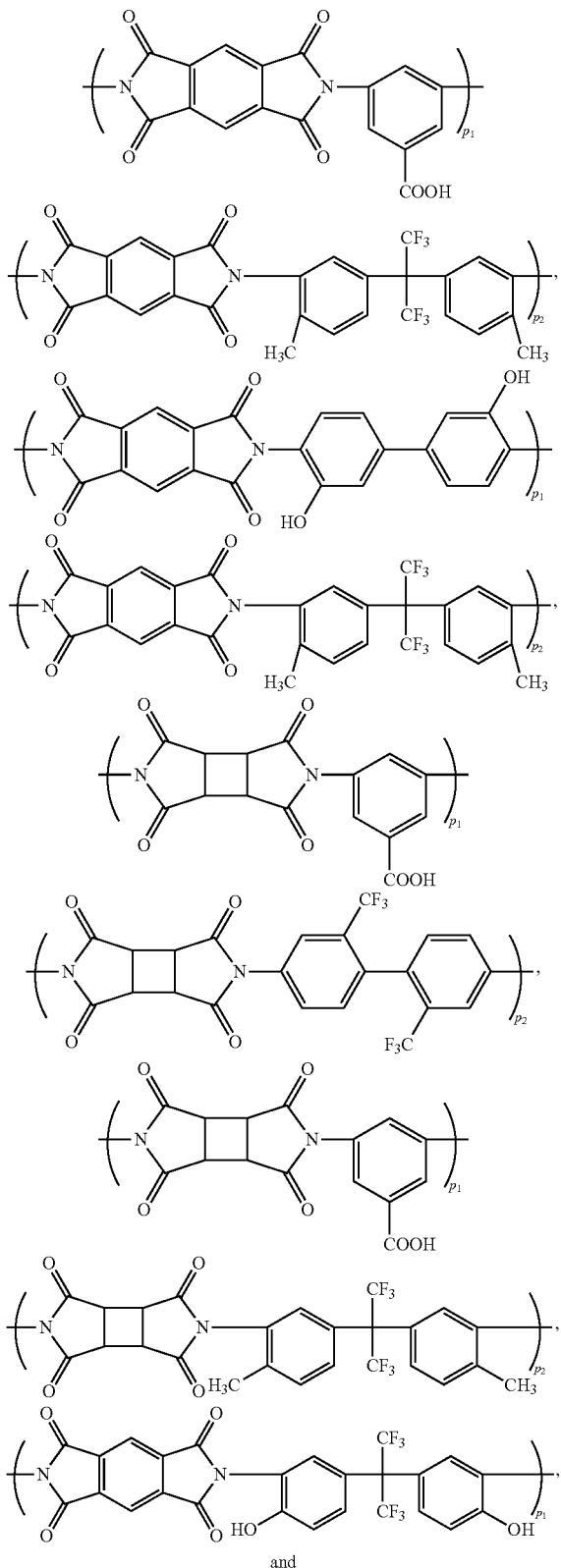
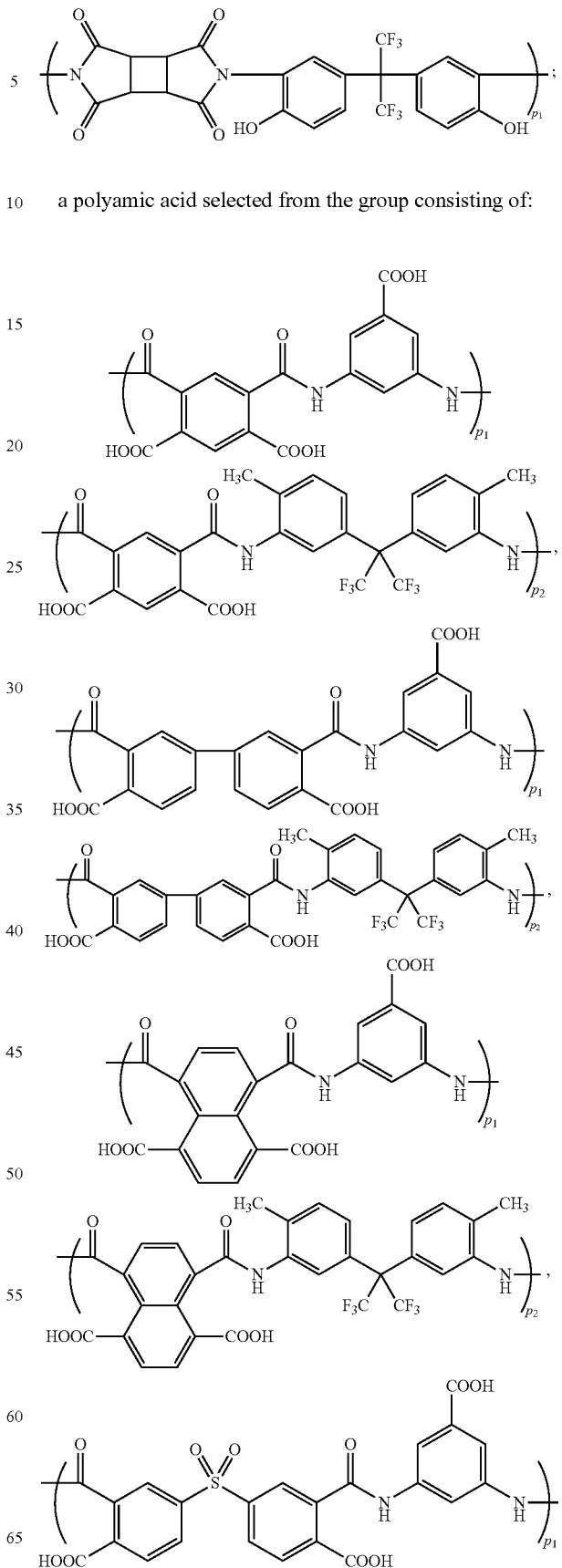
a polyamic acid selected from the group consisting of:

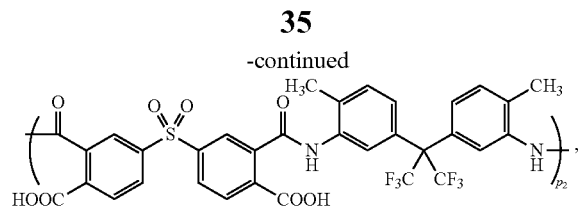
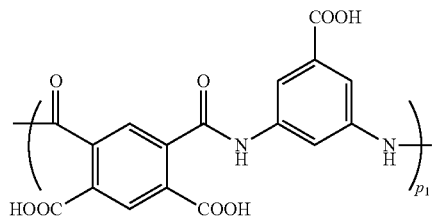
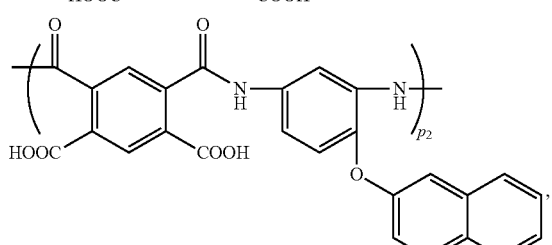
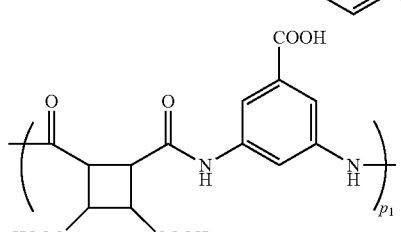
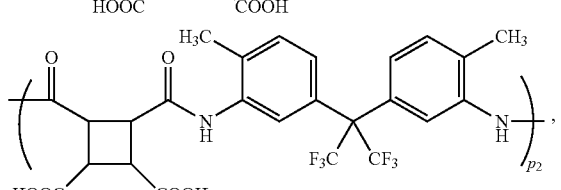
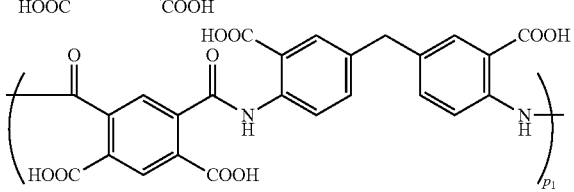
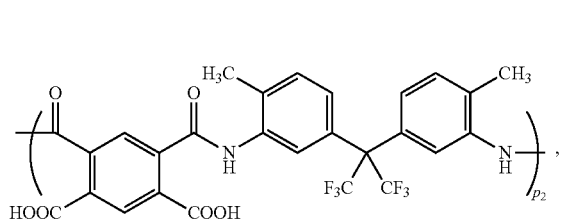
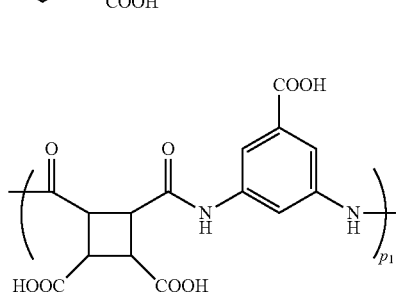
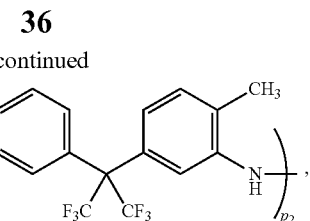
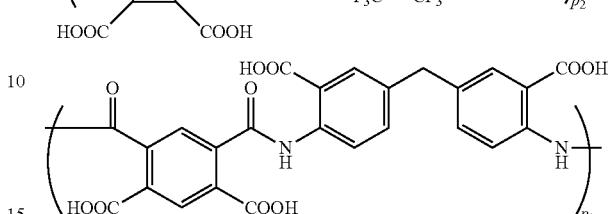
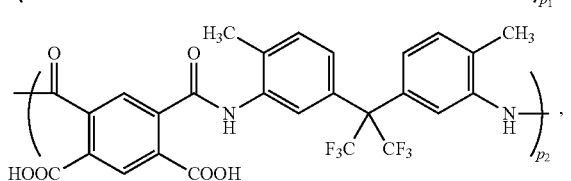
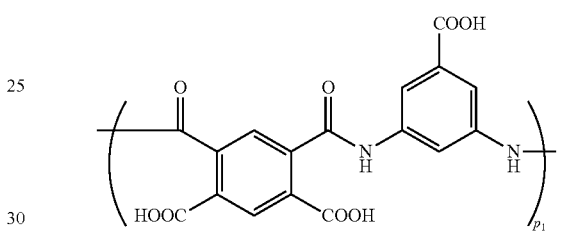
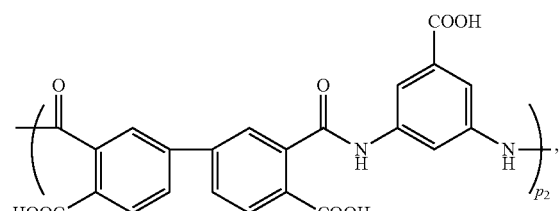
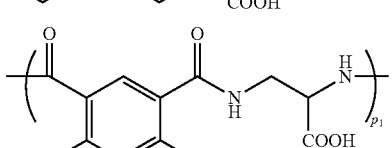
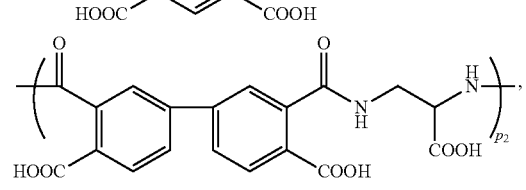
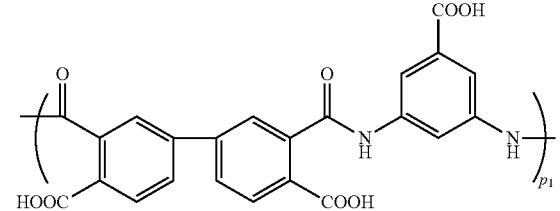
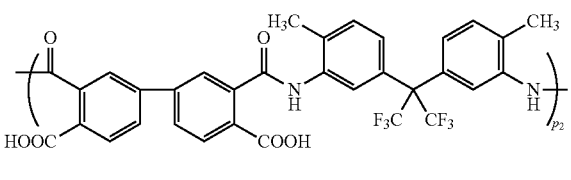

-continued

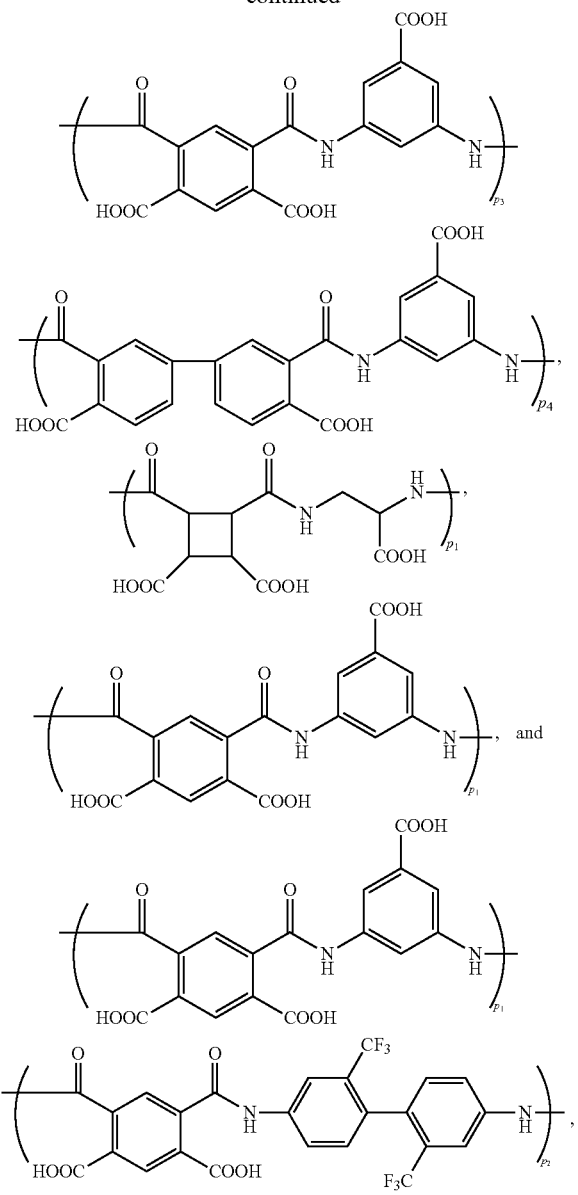

wherein p1, p2, p3 and p4, when listed are present in the polyimide or the polyamic acid, and correspond independently of each other to a proportion of each unit in the polyimide or the polyamic acid such that a sum of p1, p2, p3 and p4 in the polyimide or the polyamic acid is 100%;
a compound produced from a compound having at least two epoxy groups and a compound having at least two phenolic hydroxy groups or carboxyl groups; and
a compound of the following formula:

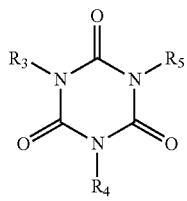

wherein $R_3$, $R_4$ and $R_5$ independently of one another are a group of formula (3):

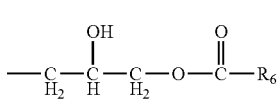 (3)

and wherein $R_6$ is a benzene ring, a naphthalene ring or an anthracene ring having 1 to 3 hydroxy groups.

2. The anti-reflective coating forming composition according to claim 1, further containing a light absorbing compound.

3. The anti-reflective coating forming composition according to claim 1, further containing an amine compound.

4. A method of forming a photoresist pattern used in a manufacture of a semiconductor device, comprising:
coating the anti-reflective coating forming composition according to claim 1 on a semiconductor substrate and baking the semiconductor substrate coated with the anti-reflective coating forming composition to form an anti-reflective coating,
forming a photoresist layer on the anti-reflective coating,
exposing the semiconductor substrate covered with the anti-reflective coating and the photoresist layer to light, and
developing the photoresist layer and the anti-reflective coating on the semiconductor substrate after the exposing.

5. The method of forming a photoresist pattern according to claim 4, wherein the exposing is carried out with light having a wavelength of 193 nm or 248 nm.

* * * * *